United States Patent
Chen et al.

(10) Patent No.: US 9,177,627 B2
(45) Date of Patent: Nov. 3, 2015

(54) METHOD FOR IMPROVING THE STABILITY, WRITE-ABILITY AND MANUFACTURABILITY OF MAGNETO-RESISTIVE RANDOM ACCESS MEMORY

(71) Applicants: Laurence Lujun Chen, Hayward, CA (US); Di (Laura) Chen, Xi'an (CN); Michael Meng Chen, Hayward, CA (US)

(72) Inventors: Laurence Lujun Chen, Hayward, CA (US); Di (Laura) Chen, Xi'an (CN); Michael Meng Chen, Hayward, CA (US)

(73) Assignee: Laurence Lujun Chen, Hayward, CA (US)

( * ) Notice: Subject to any disclaimer, the term of this patent is extended or adjusted under 35 U.S.C. 154(b) by 0 days.

(21) Appl. No.: 13/987,786

(22) Filed: Sep. 3, 2013

(65) Prior Publication Data
US 2015/0063011 A1 Mar. 5, 2015

(51) Int. Cl.
*G11C 11/00* (2006.01)
*G11C 11/16* (2006.01)

(52) U.S. Cl.
CPC .................................. *G11C 11/1675* (2013.01)

(58) Field of Classification Search
CPC .... G11C 11/02; G11C 11/16; G11C 11/1673; G11C 11/1675; G11C 11/1677
USPC .................. 365/158, 148, 171, 173, 200, 201
See application file for complete search history.

(56) References Cited

U.S. PATENT DOCUMENTS

| | | | |
|---|---|---|---|
| 7,309,617 B2 | 12/2007 | Ruehrig et al. | |
| 7,345,912 B2 | 3/2008 | Luo et al. | |
| 7,379,327 B2* | 5/2008 | Chen et al. ................... | 365/158 |
| 7,453,747 B2 | 11/2008 | Abraham et al. | |
| 7,747,926 B2 | 6/2010 | Wise et al. | |
| 7,933,137 B2 | 4/2011 | Dimitrov et al. | |
| 8,248,841 B2 | 8/2012 | Yang | |
| 8,281,221 B2 | 10/2012 | Sakimura et al. | |
| 8,320,167 B2 | 11/2012 | Rao et al. | |
| 8,462,543 B2 | 6/2013 | Zheng et al. | |
| 8,879,302 B2* | 11/2014 | Gaertner et al. ............. | 365/148 |
| 2010/0177558 A1 | 7/2010 | Sakimura et al. | |

* cited by examiner

*Primary Examiner* — Tan T. Nguyen

(57) ABSTRACT

This invention provides the method to overcome 4 backwards which limit the manufacturability or production yield rate of Magneto-resistive random access memory (MRAM). The key points of this invention are: (1) providing method to improve the manufacturability through reducing bias variation, by using a compensation module to correct the bias point of extreme cells; (2) providing method to improve the manufacturability through removing outlier cells (called bad cells), by using "writing jump-over" and "reading exclusion" to exclude bad-cells; (3) providing method to reduce the bias point, amplitude and asymmetry variation, using shared fixed-magnetic-reference-layer and proper shape anisotropy; (4) providing method to improve the write-ability, using flipping-assistant-field to speed up STT flipping process by large current, and using heating resistance and heating cells by the same current (including global heating, row heating, column heating, or local cell heating, i.e. heating with conventional thermal nature or heating with thermagnonic spin-transfer torque).

17 Claims, 19 Drawing Sheets

Figure 1:
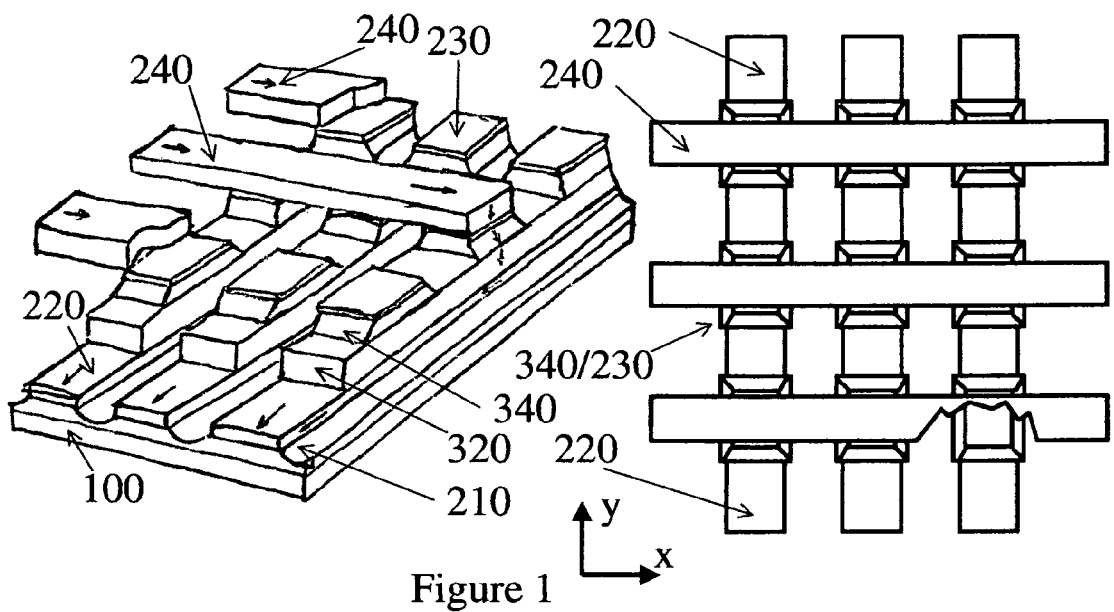

METHOD FOR IMPROVING THE STABILITY, WRITE-ABILITY AND MANUFACTURABILITY OF MAGNETO-RESISTIVE RANDOM ACCESS MEMORY

CROSS-REFERENCE TO RELATED APPLICATION

The application claims the priority from U.S. provisional application No. 61/744,786, filed on Sep. 7, 2012 with post mail date on Sep. 4, 2012, and tilted "Method for Improving the Stability, Write-ability and Manufacturability of Magneto-resistive Random Access Memory".

FIELD OF INVENTION

This invention provides the method to overcome 4 backwards which limit the manufacturability or production yield rate of Magneto-resistive random access memory (MRAM): large bias point variation, reading performance variation, writing performance variation & poor write-ability, and outlier cells. The key points of this invention are: (1) providing method to reduce bias variation, by using a compensation module to correct the bias point of extreme cells; (2) providing method to remove outlier cells (called bad cells), by using "writing jump-over" and "reading exclusion" modules to exclude bad-cells by well magnetic and geometrical design; (3) providing method to reduce the bias point variation, and amplitude and asymmetry variation; (4) providing method to improve the write-ability.

BACKGROUND OF INVENTION

Magneto-resistive random access memory (MRAM) is non-volatile random access memory technology that has been under development sine 1995 by Motorola (the division later became Freescale); in 2000, Spintec laboratory filed first Spin Torque Transfer (STT) patent, which utilizes a spin-polarized current through the tunneling magneto-resistance layer to write data, and consumes less power and is more scalable than conventional MRAM; in 2005, Renesas Technology and Grandis collaborated on development of 65 nm MRAM employing STT, and Sony announced the first lab-produced spin-torque-transfer MRAM, with further advances in materials, this process should allow densities higher than those possible in DRAM. However, now it has manufacturability problem, and so it is still far away from volume production and is extreme expensive (in term of $ per Gb) due to three main backwards: (1) large bias point variation, (2) reading performance variation - - - large amplitude (AMP) and asymmetry (ASYM) range variation, (3) writing performance variation - - - poor write-ability, means switching between states sometimes cannot be completed in given time, and (4) outlier cells (in bias and performance) are the main limitation for MRAM, even though it is not a limitation recording head of hard disk drive. Due to these backwards (1) and (2), it is difficulty to use coding, decoding and equalization methods which are currently used in hard disk drive.

| patent/application No. | time | inventors |
|---|---|---|
| 7,309,617 | December 2007 | Ruehrig et al. |
| 7,345,912 | March 2008 | Luo et al. |
| 7,453,747 | November 2008 | Abraham el al |
| 7,747,926 | June 2010 | Wise et al. |
| 7,933,137 | April 2011 | Dimitrov, et al. |
| 8,248,841 | August 2012 | Yang |
| 8,281,221 | October 2012 | Sakimura, et al. |
| 8,320,167 | November 2012 | Rao, et al. |
| 8,462,543 | Jun. 11, 2013 | Zheng; Yuankai et al |
| 2010/0177558 | July 2010 | Sakimura et al. |

SUMMARY OF THE INVENTION

This invention provides the method to overcome all the 4 backwards which limit manufacturability or production yield rate of magneto-resistive random access memory MRAM: large bias point variation, reading performance variation, writing performance variation & poor write-ability, and outlier cells. The key points of this invention are: (1) providing method to improve the manufacturability through reducing bias variation, by using a compensation module (built-together with or separated from MRAM) to correct the bias point of extreme cells; (2) providing method to improve the manufacturability through removing outlier cells (called bad cells), by using "writing jump-over" and "reading exclusion" modules to exclude bad-cells, so that manufacturability and yield rate will be greatly improved, and the coding, decoding and equalization methods which are currently used in hard disk drive can be used; (3) providing method to reduce the bias point variation, and amplitude and asymmetry variation through optimizing magnetic and geometric design and material selection, comprises (a) using shared fixed-magnetic-reference-layer (FMRL) with favorable shape anisotropy for both longitudinal and perpendicular configurations [FMRL may be either pinned layer (PL) or anti-parallel-ferro-magnetically coupled layers (AFC), or any other kind, but in the description of this invention below, we simply use "PL or AFC" for general FMRL]; (b) using anti-ferro-magnetism (AFM) material (for pinning field) with small grain size to reduce the variation due to grain size to improve the uniformity (less bias point variation) for both longitudinal and perpendicular configurations, and small grain size usually means smaller block temperature (Tb), but the shared PL or AFC has much large shape anisotropy, which will overcome the backward of lower Tb; (c) using properly larger aspect ratio (vertical to plane) of free layer (FL) for perpendicular configuration, or using rhombus, or parallelogram, or trimmed rhombus with larger FL aspect ratio (in-plane) for longitudinal configuration to eliminate the multiple edge states, and improve stability, and increase the reading signal (bias point, AMP and ASYM) uniformity; (4) providing method to improve the write-ability, comprises (a) using flipping-assistant-field to speed up STT flipping process by using large current, and/or (b) using heating resistance and heating cells by the same current used for flipping-assistant-field (including global heating, or row heating, or column heating, or local cell heating, i.e. heating with conventional thermal nature or heating with thermagnonic spin-transfer torque).

DETAIL DESCRIPTION OF THE INVENTION

Figure 2:
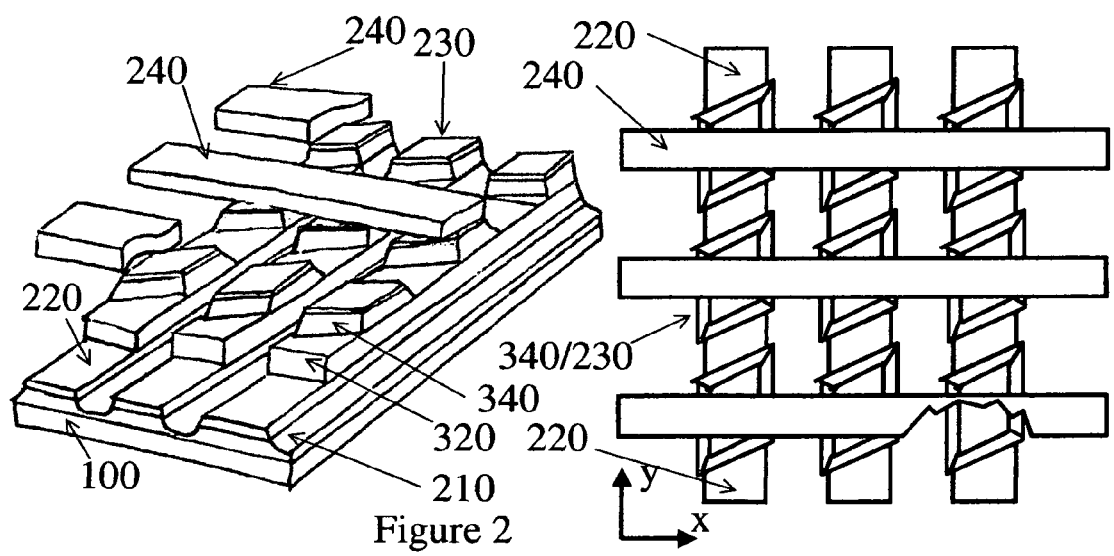
Figure 3:
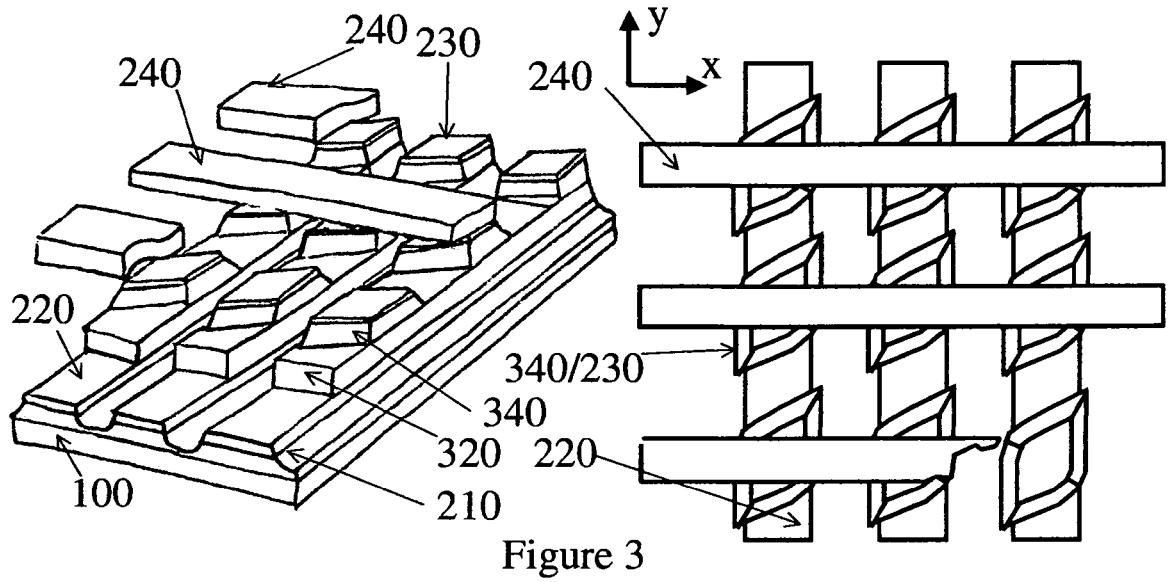
Figure 4:
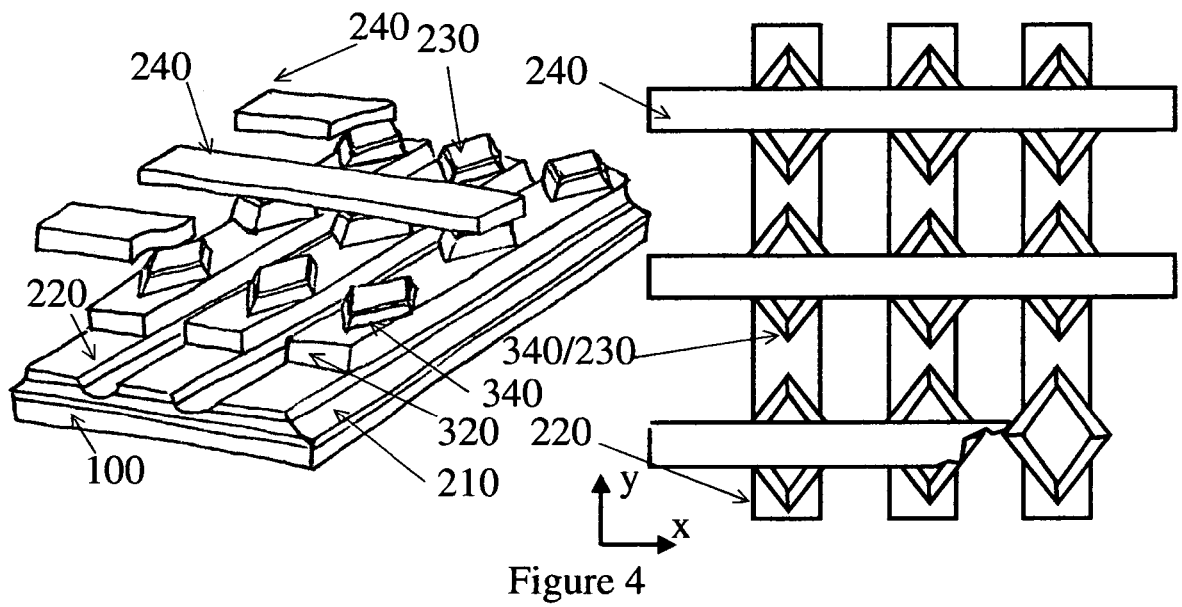
Figure 5:
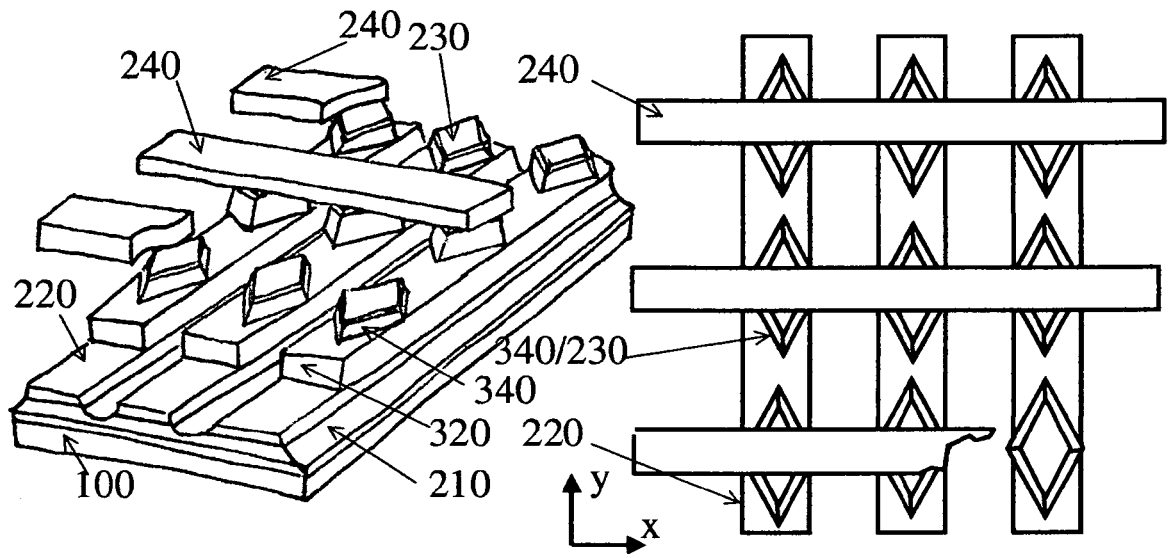
Figure 6:
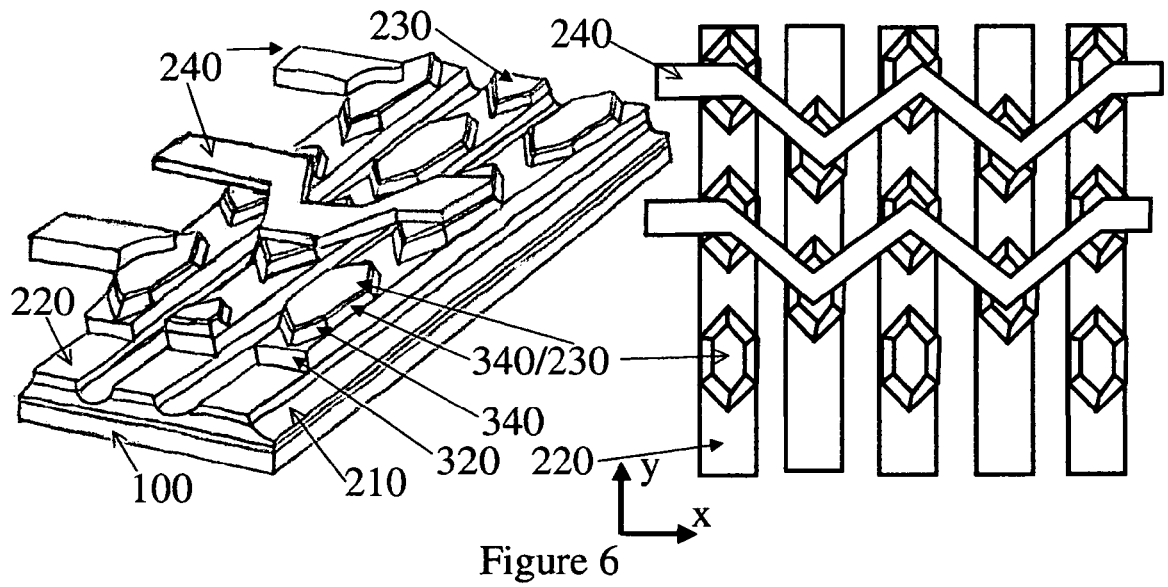
Figure 7:
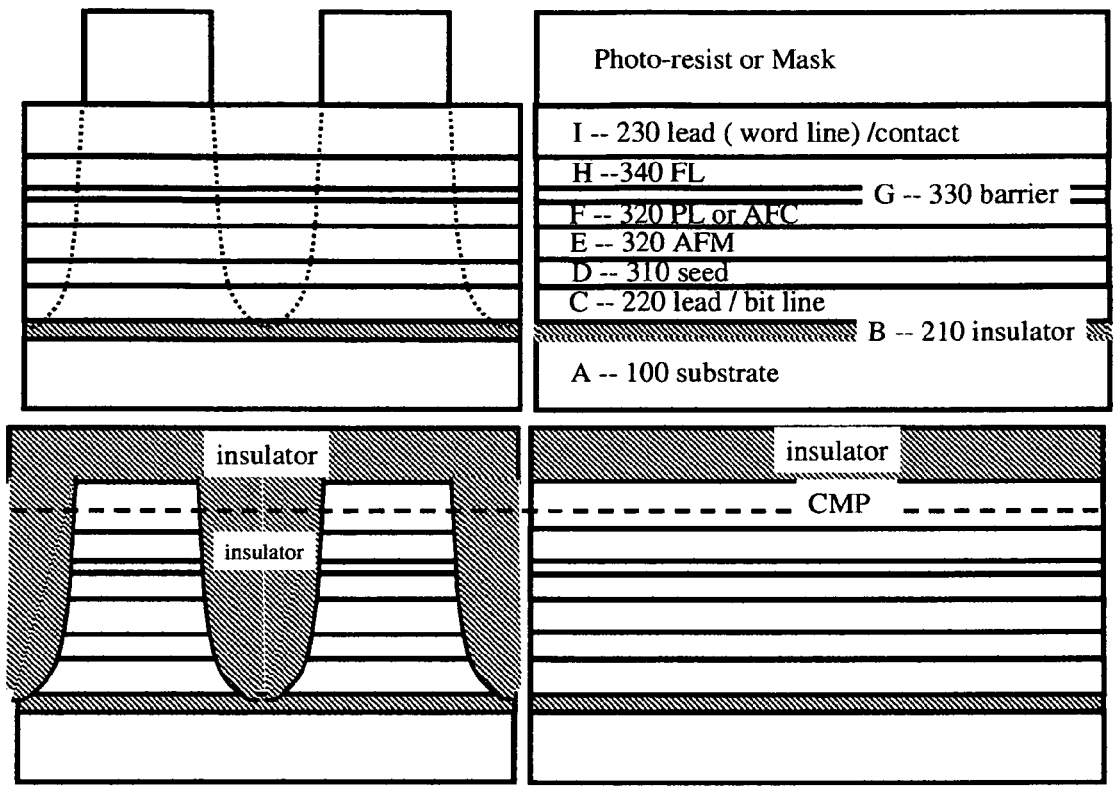
Figure 8:
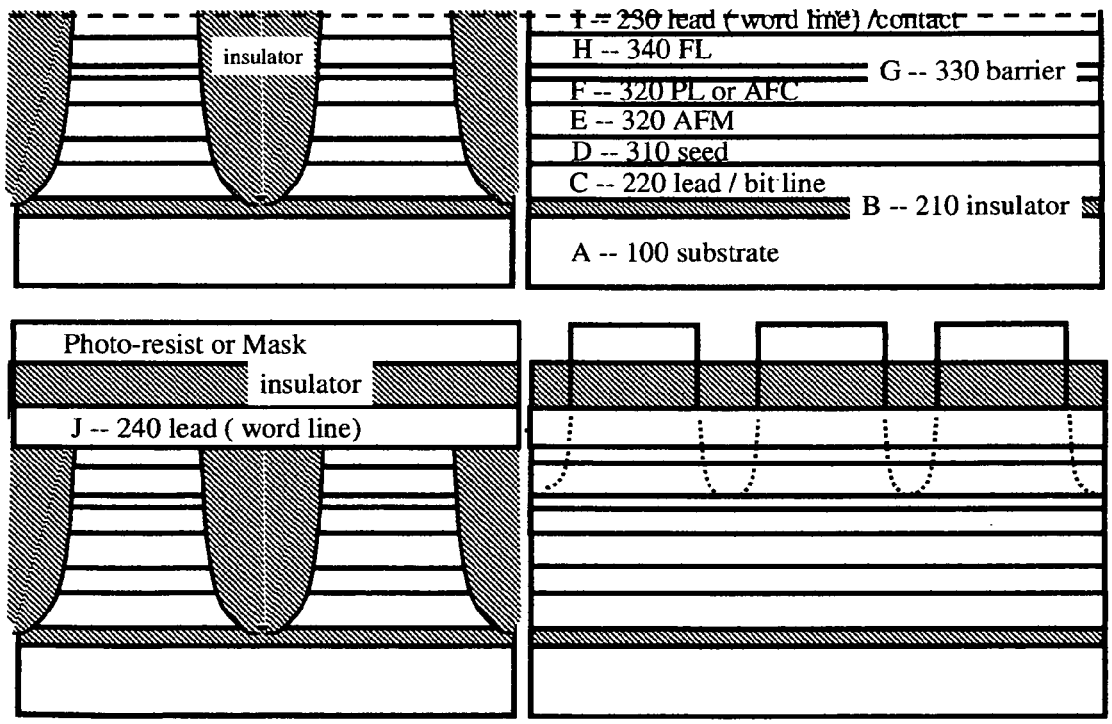
Figure 9:
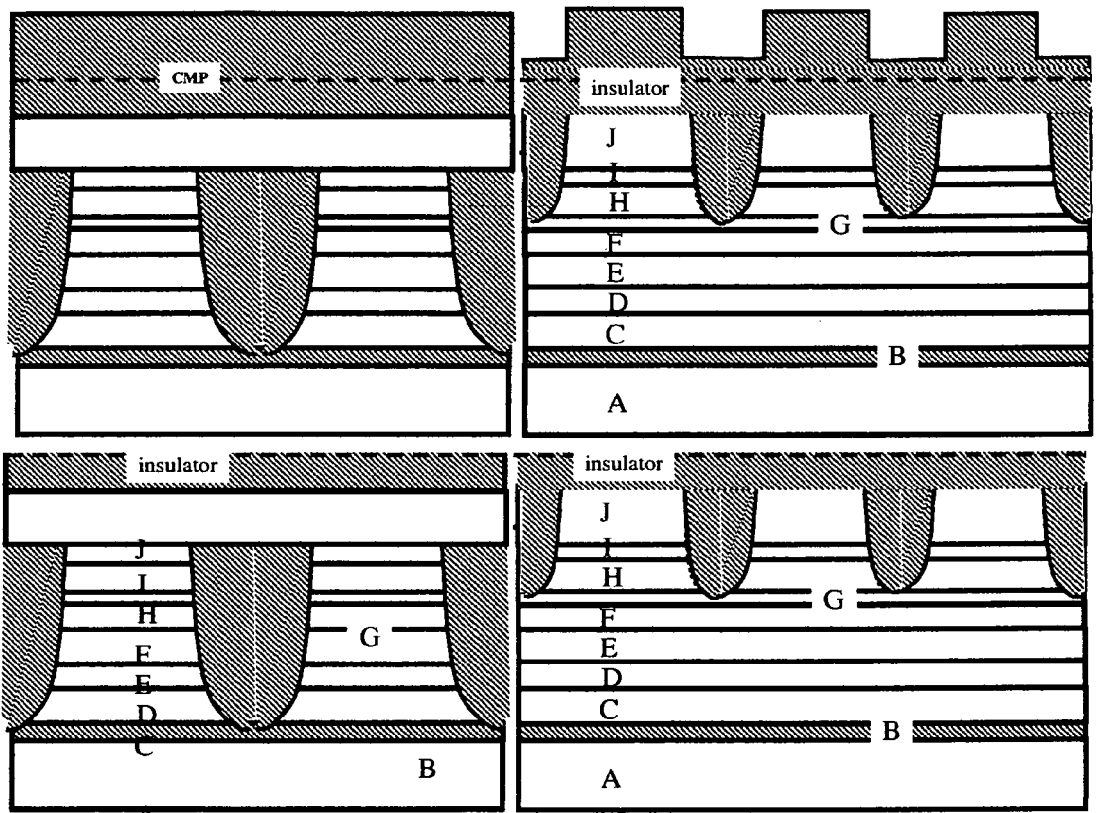
Figure 10:
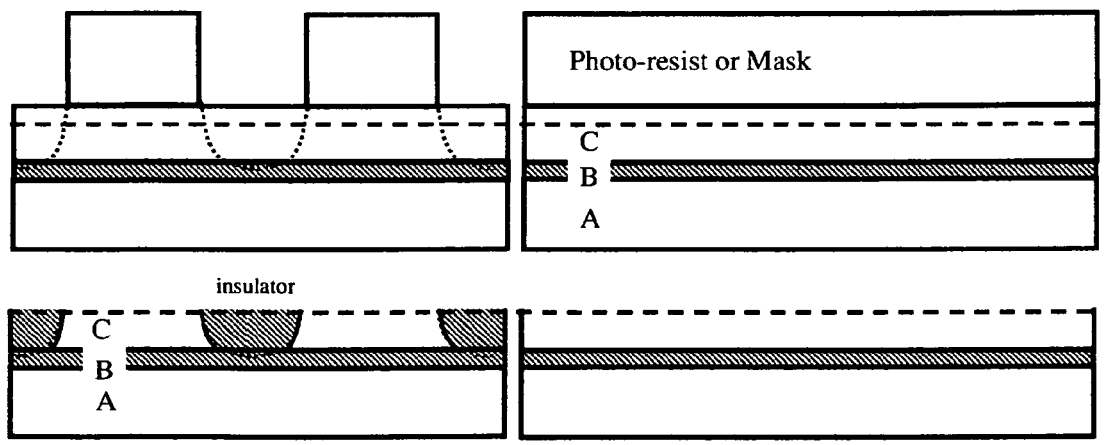
Figure 11:
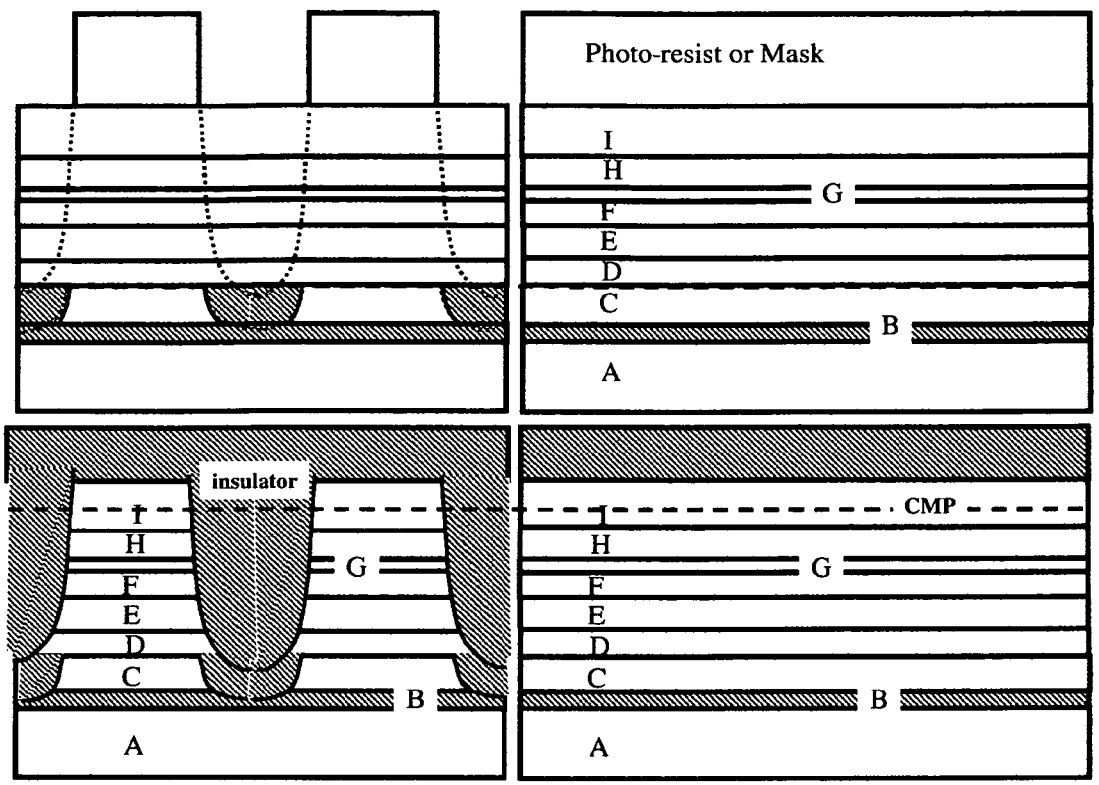
Figure 12:
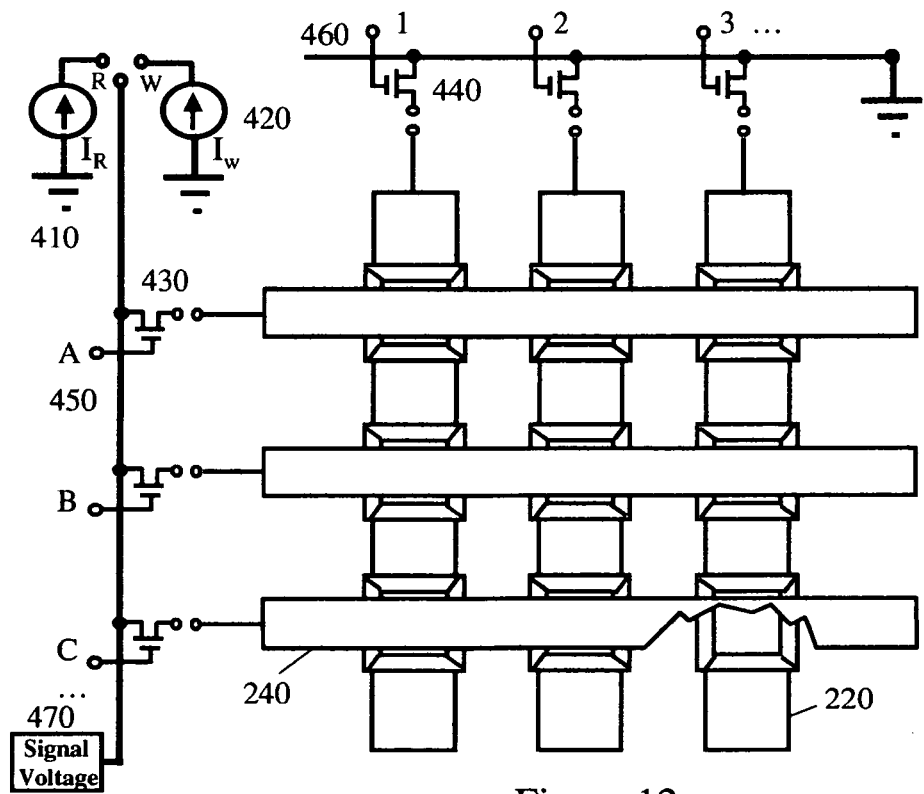
Figure 13:
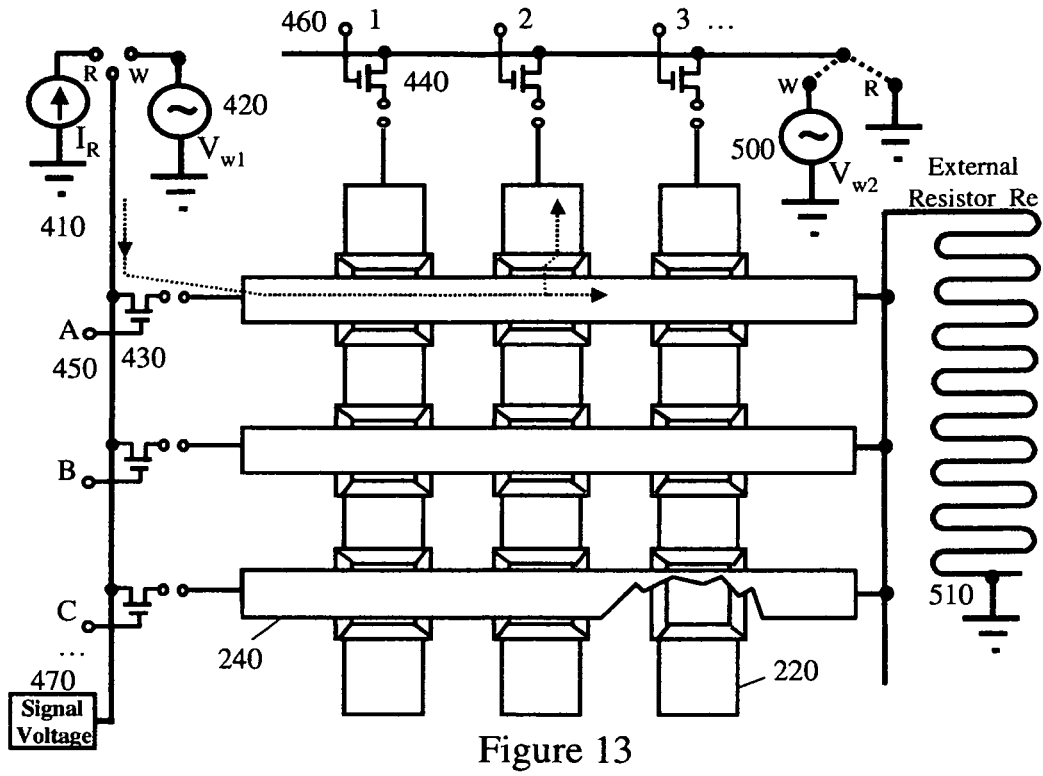
Figure 14:
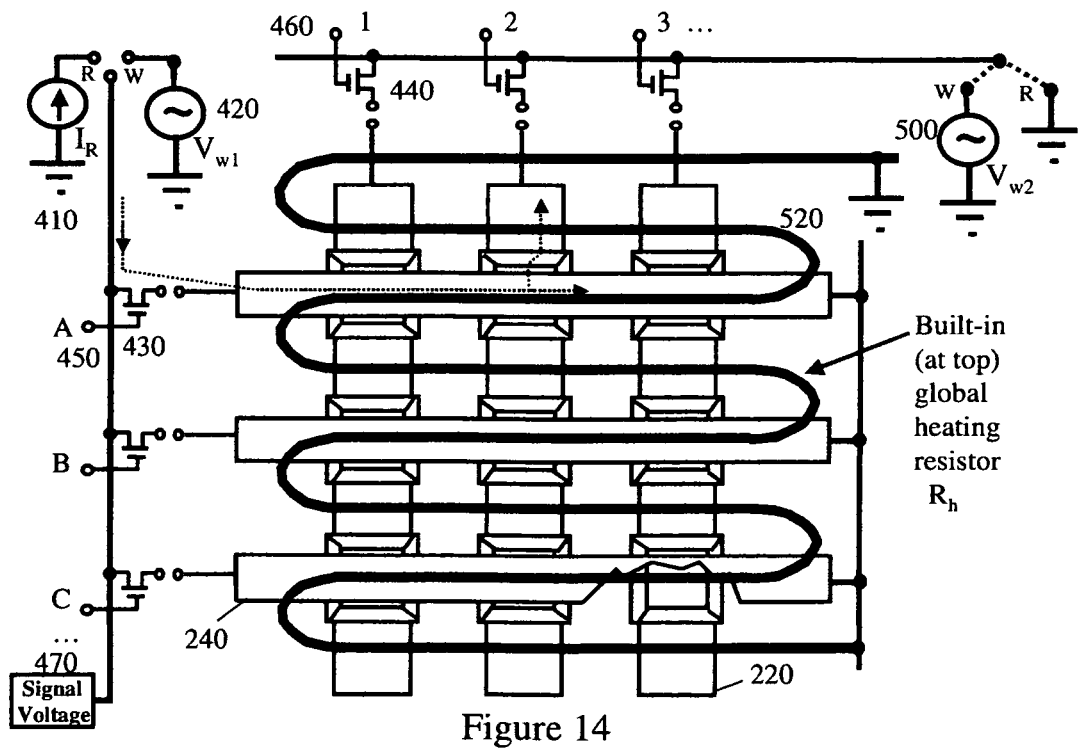
Figure 15:
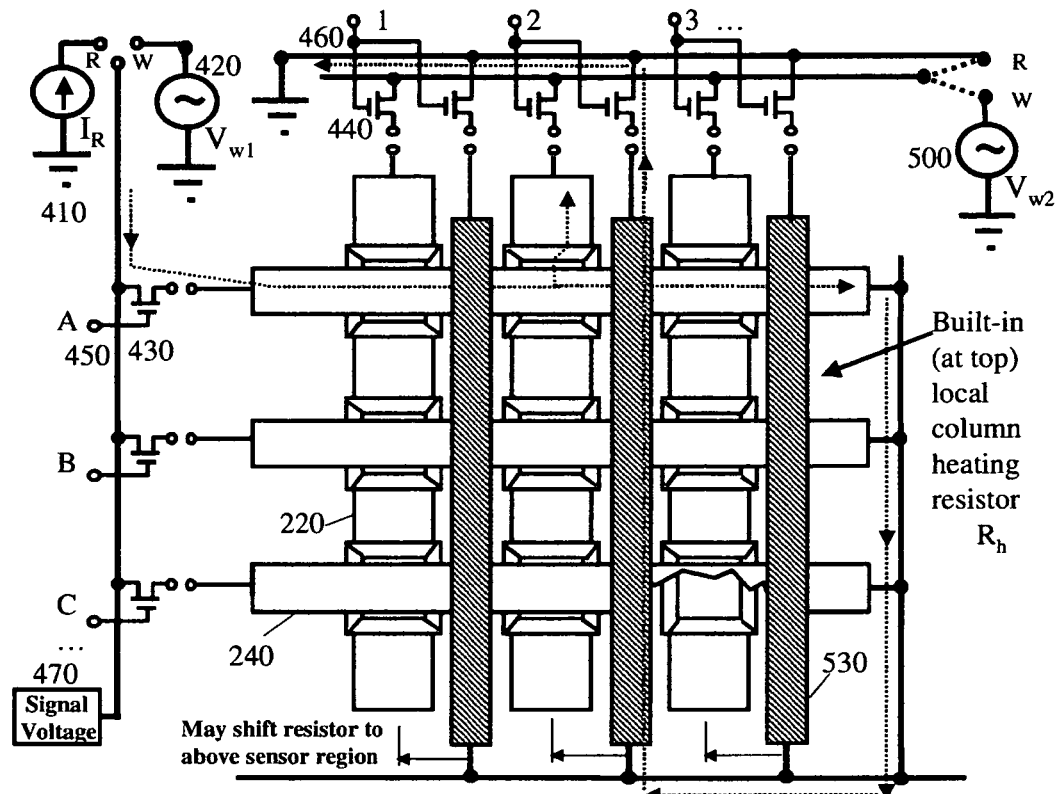
Figure 16:
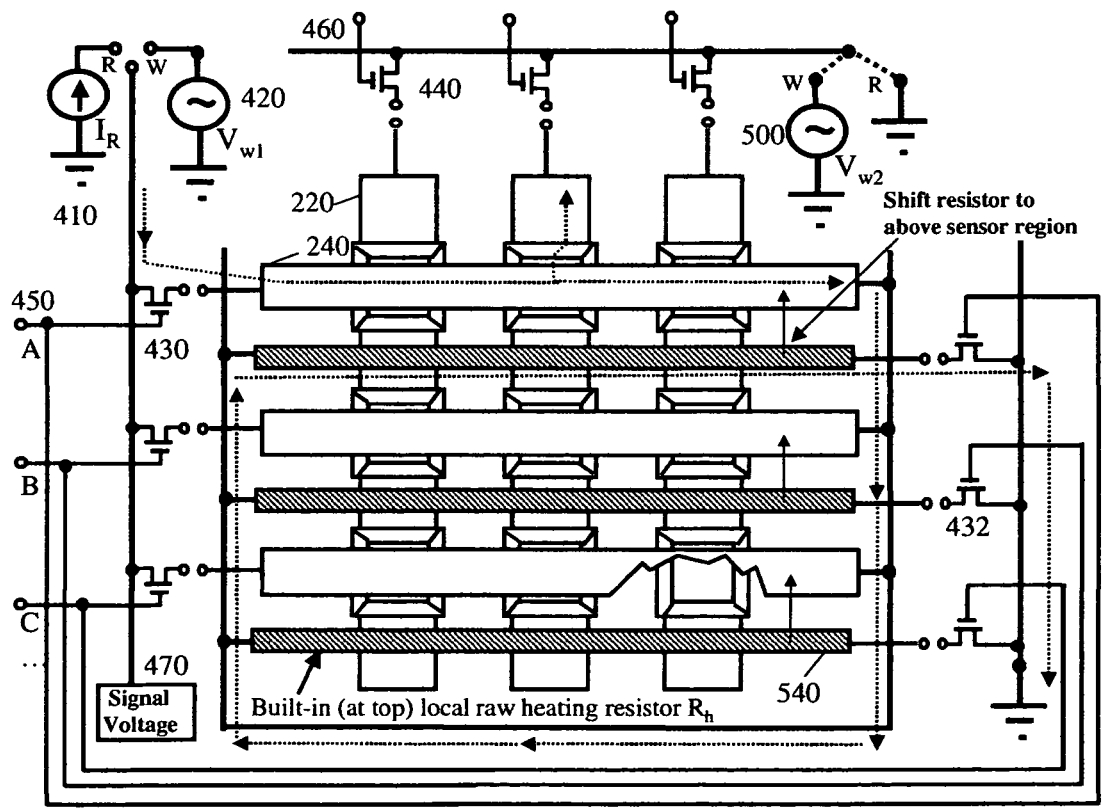
Figure 17A:
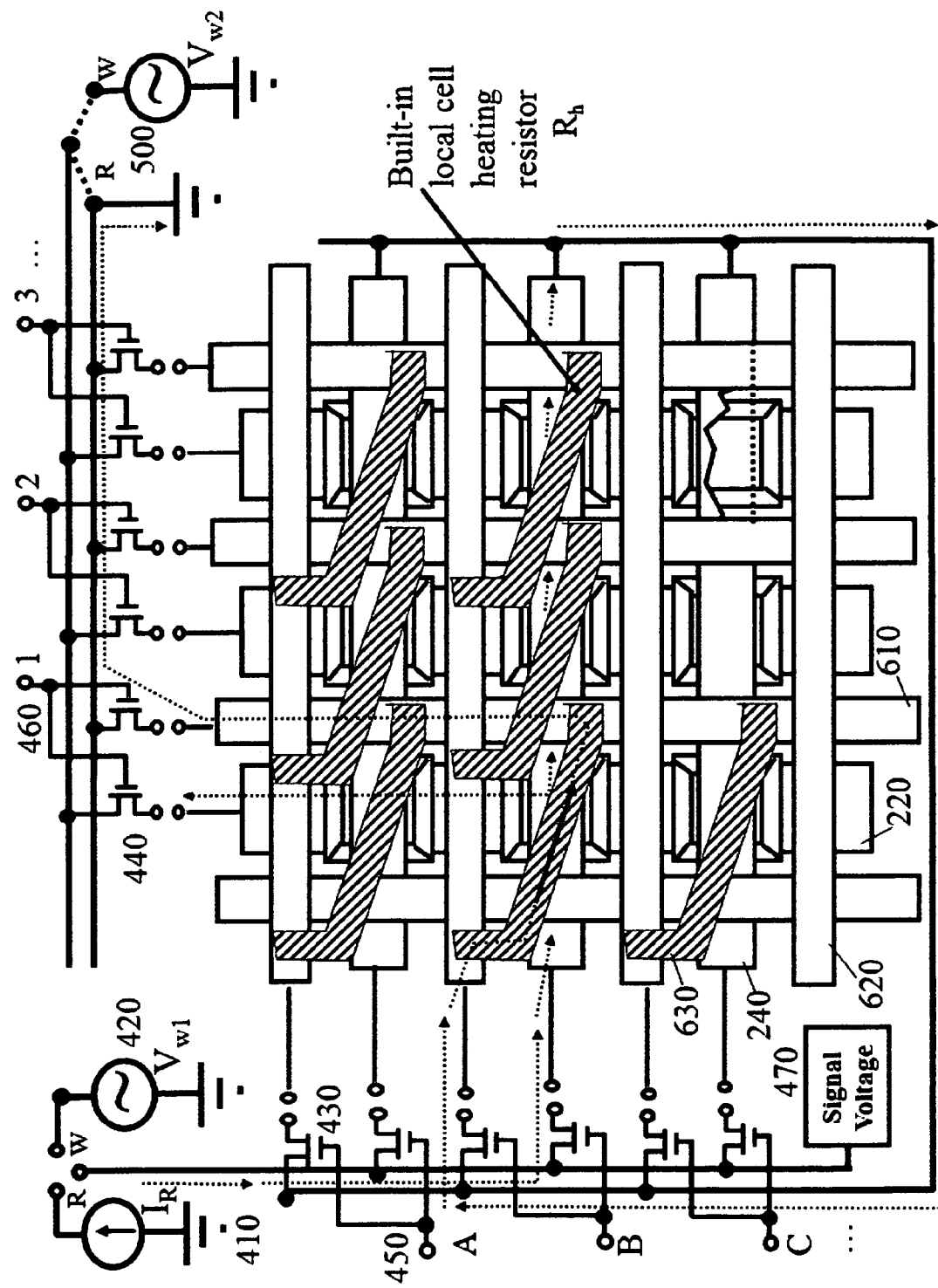
Figure 17B:
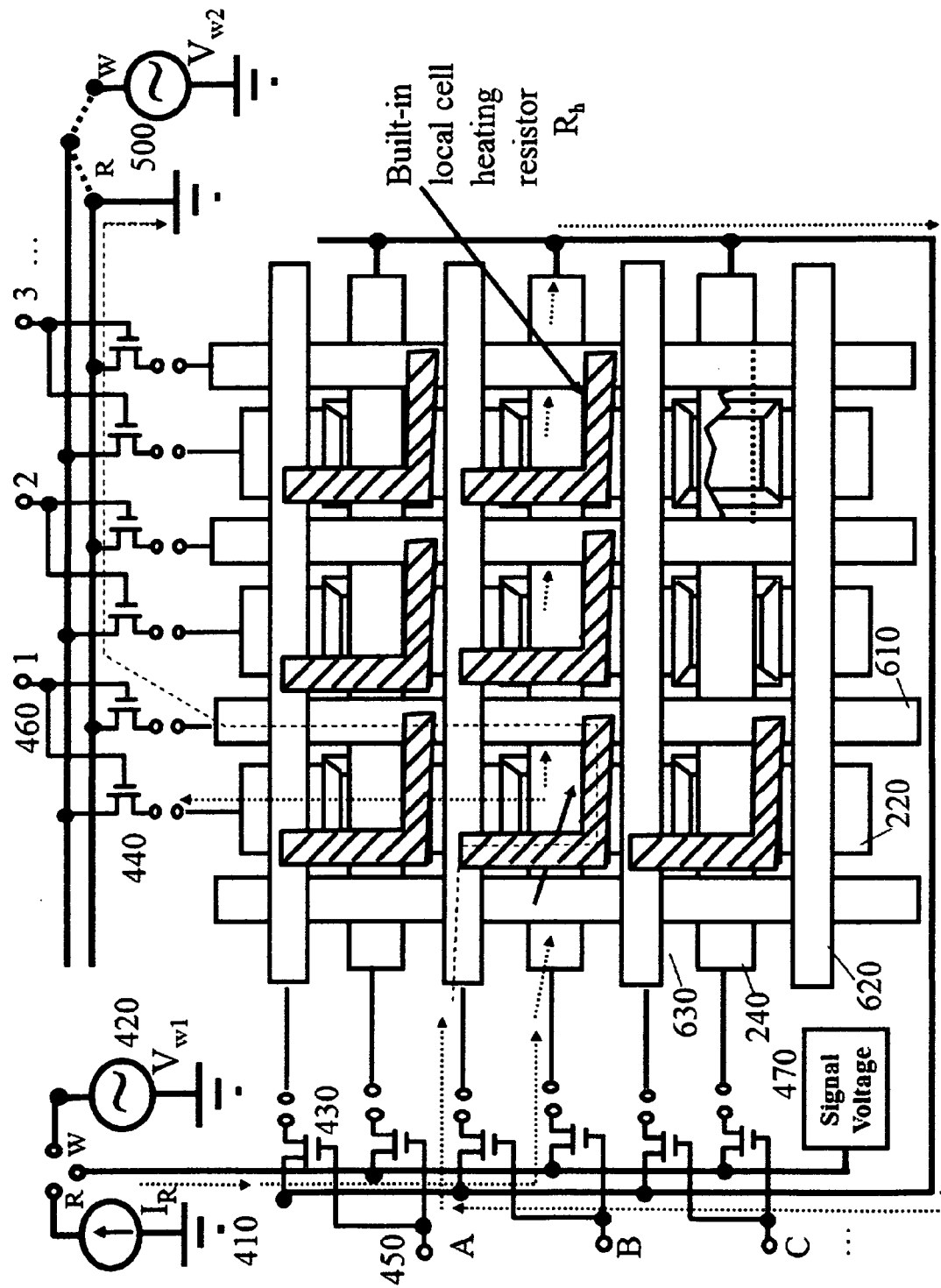
Figure 18:
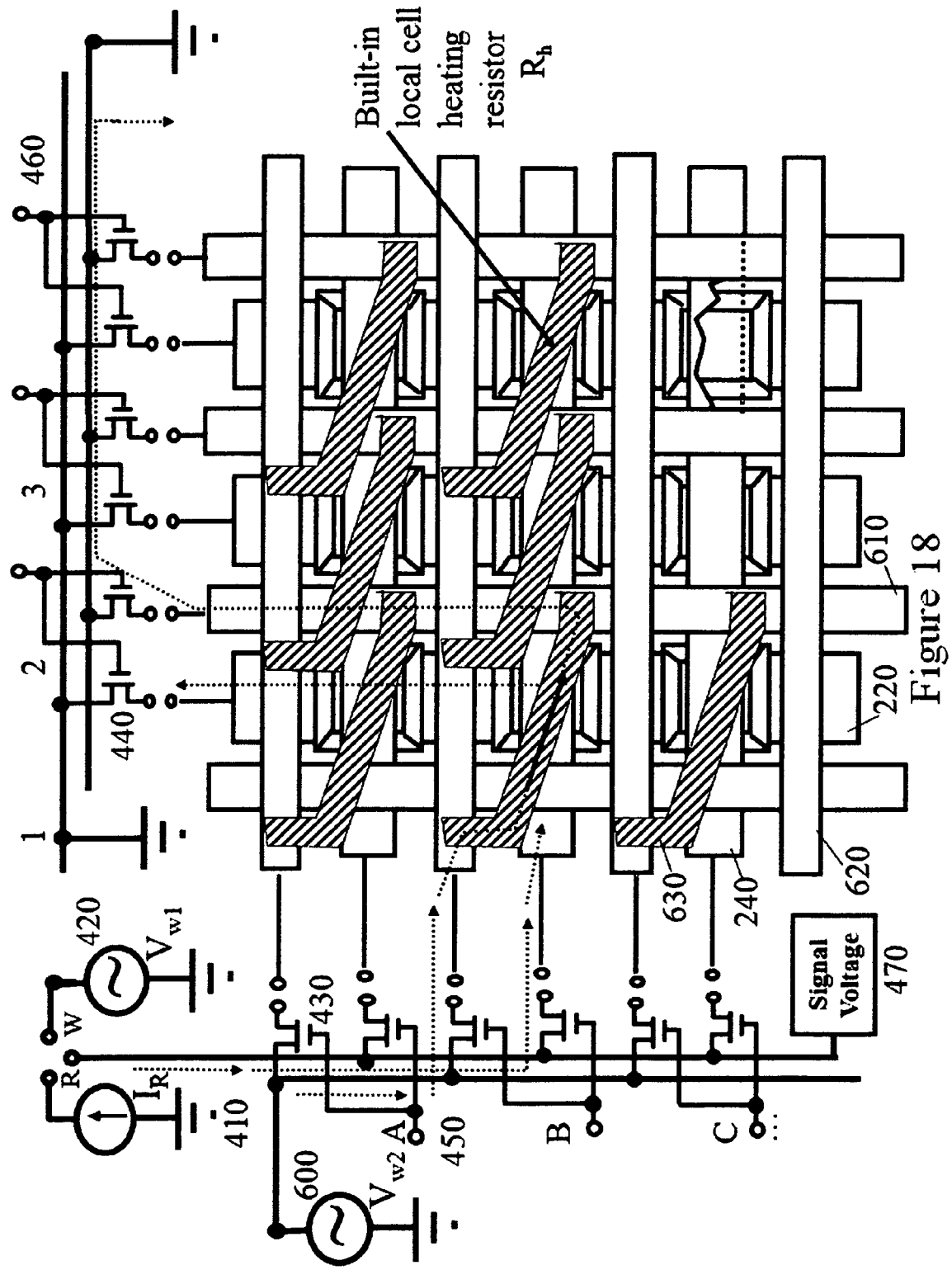
Figure 19:
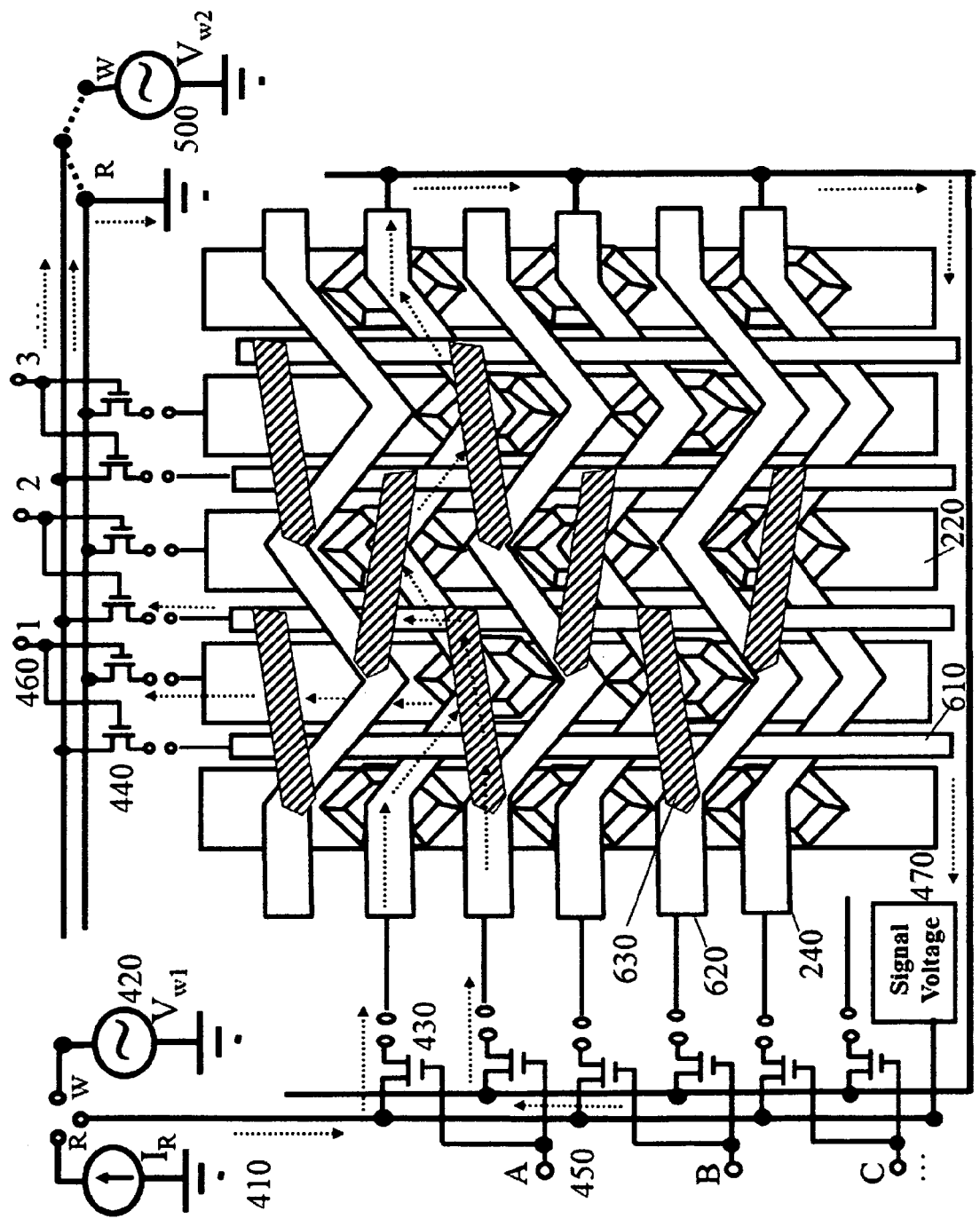
Figure 20:
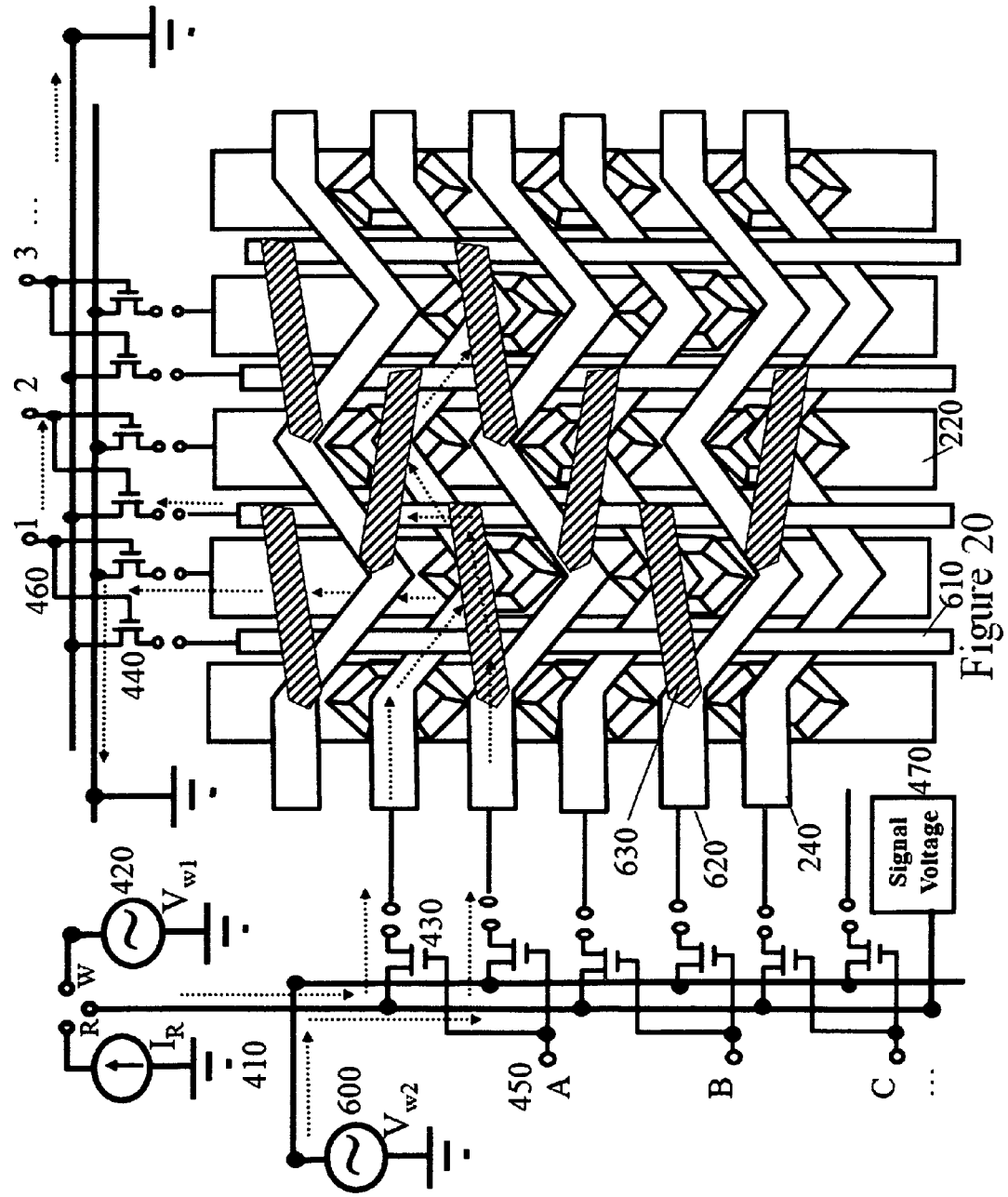
Figure 21:
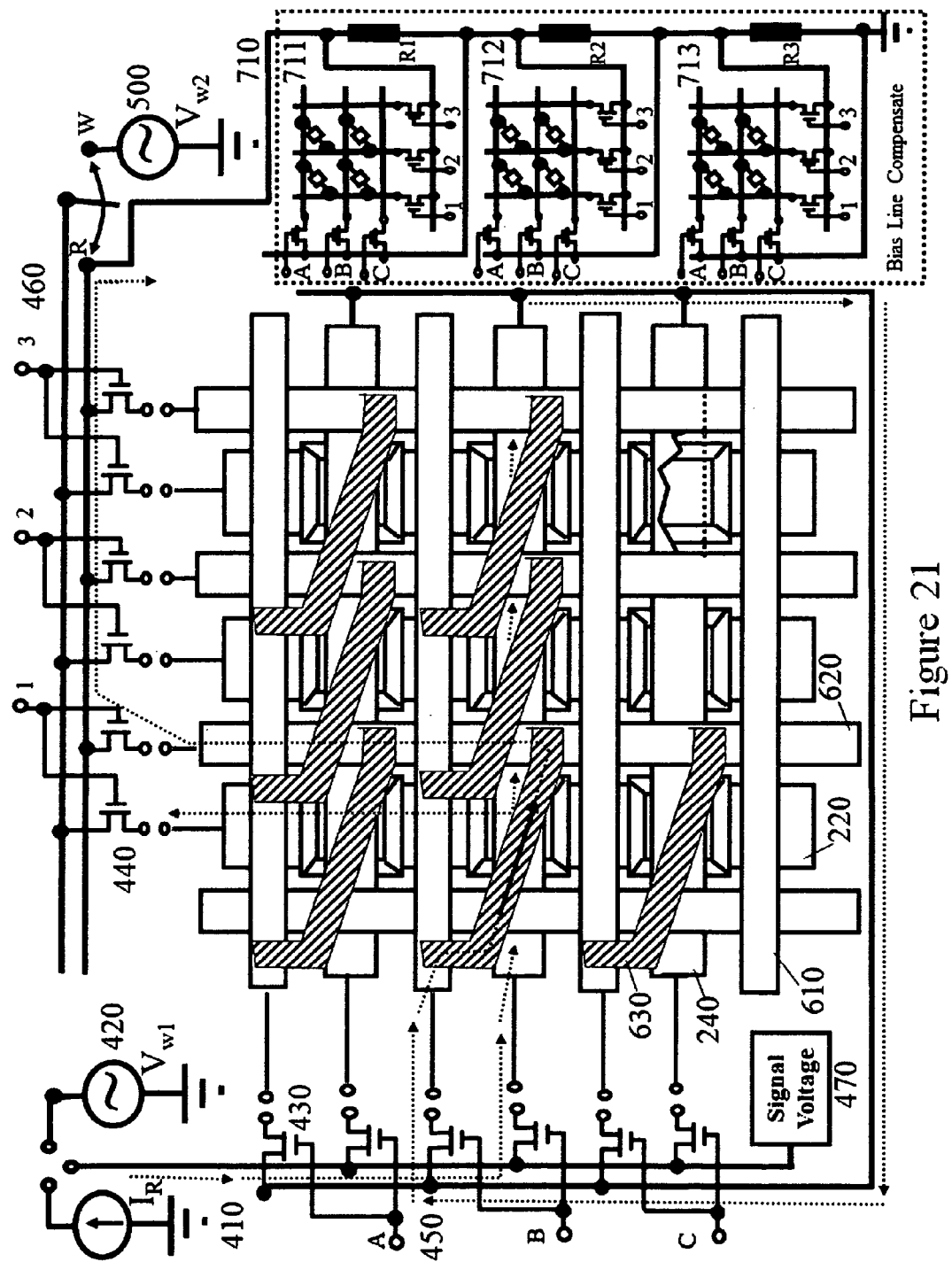
Figure 22:
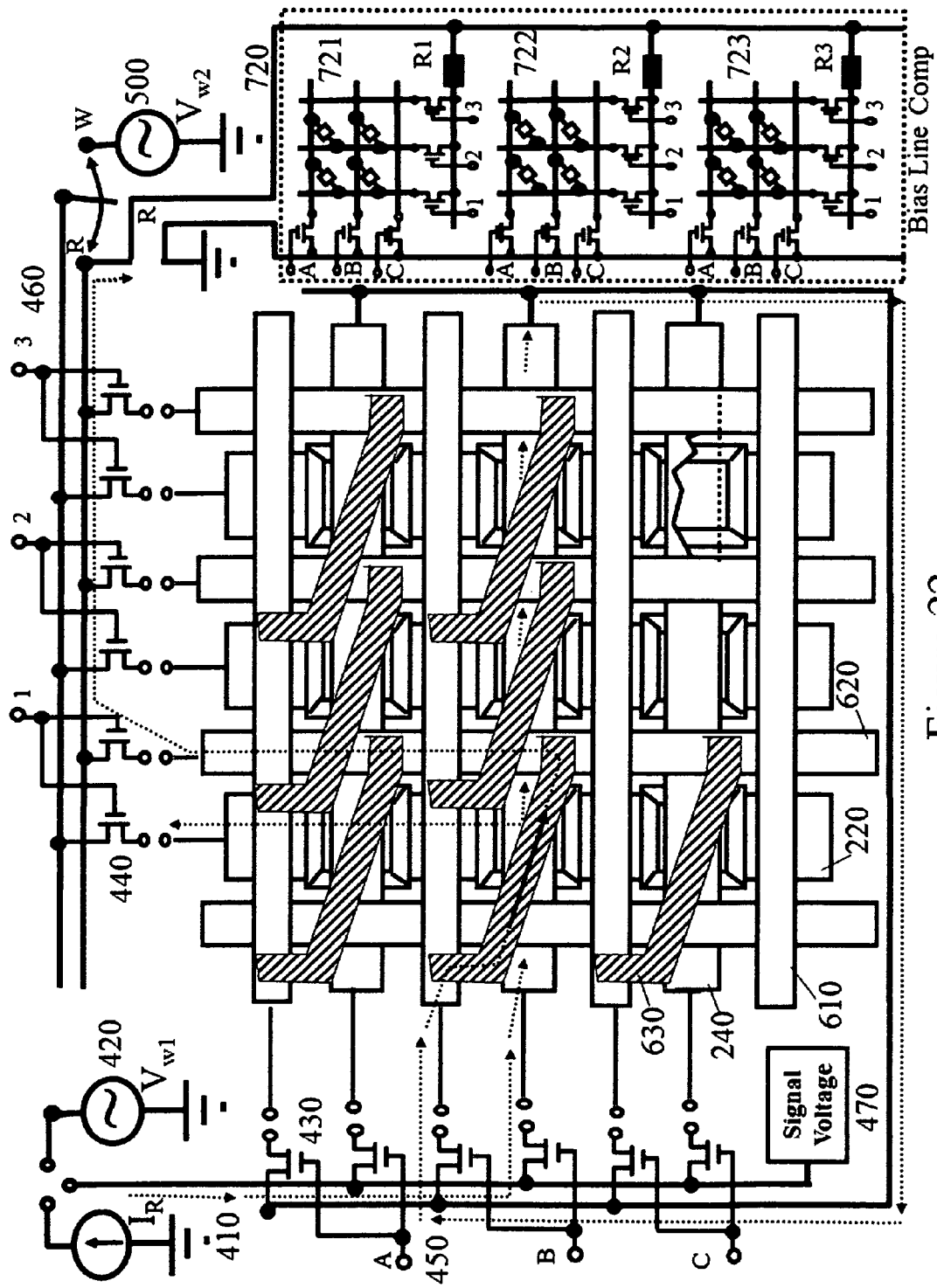
Figure 23:
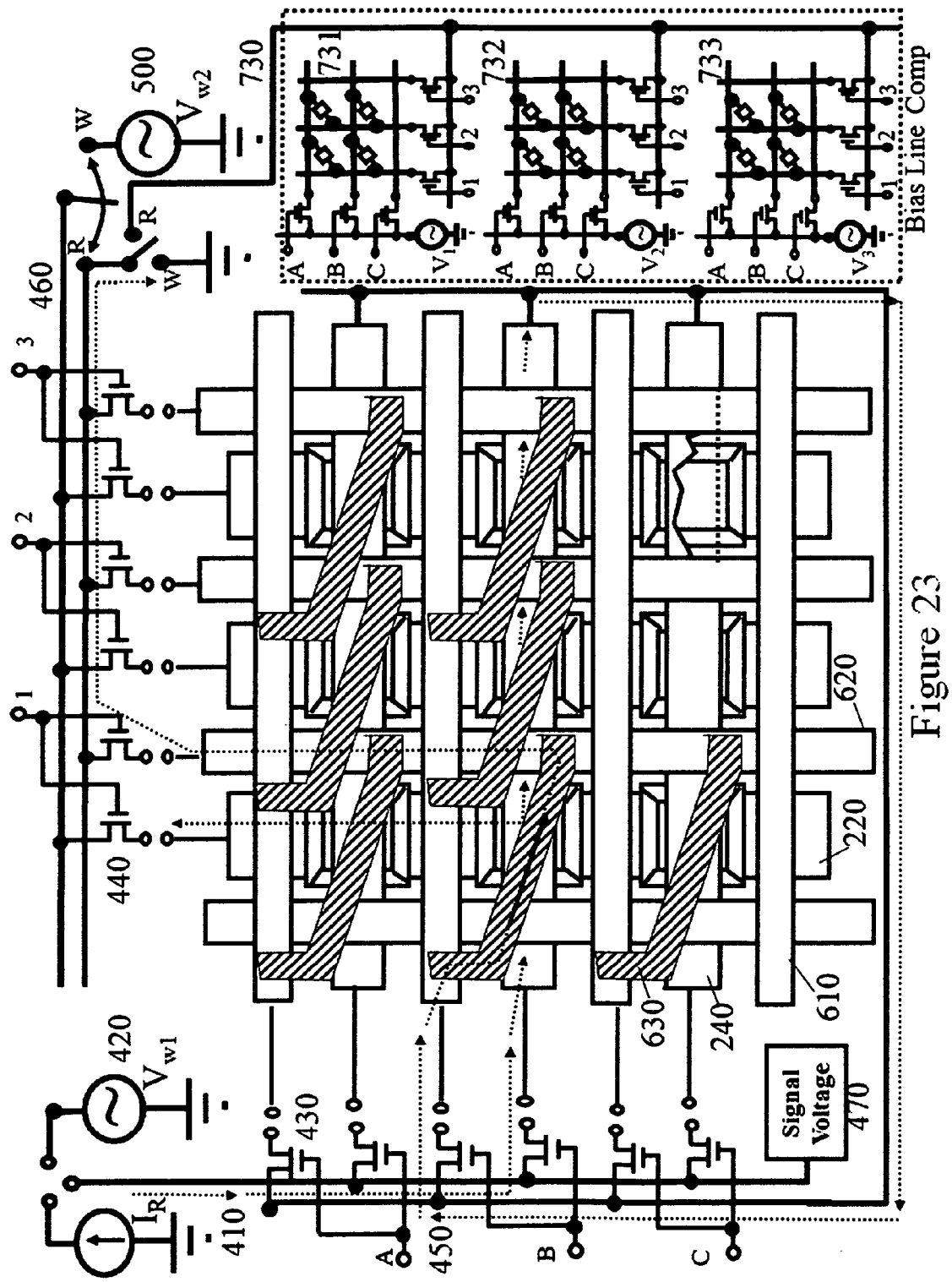
Figure 24:
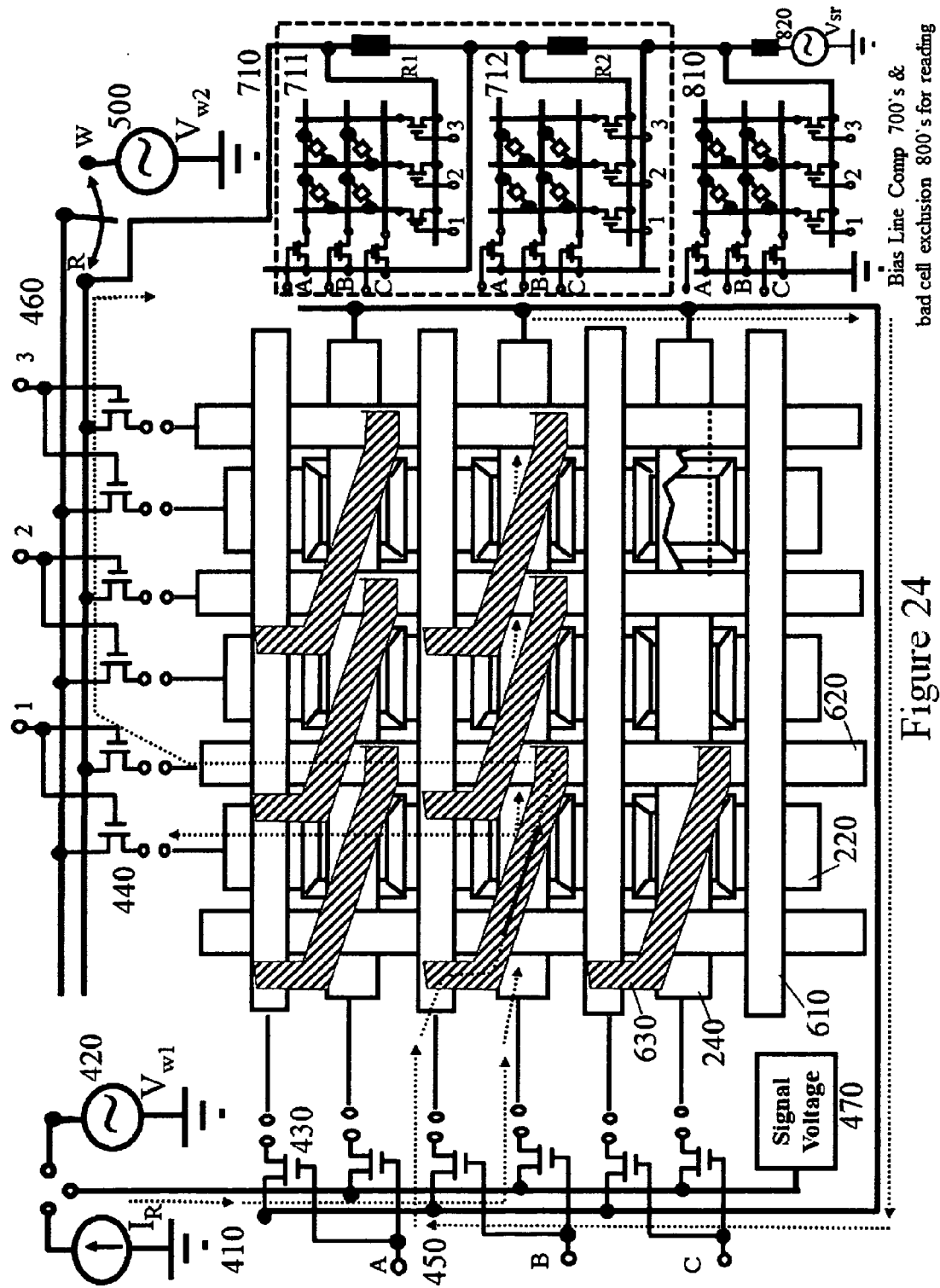
Figure 25:
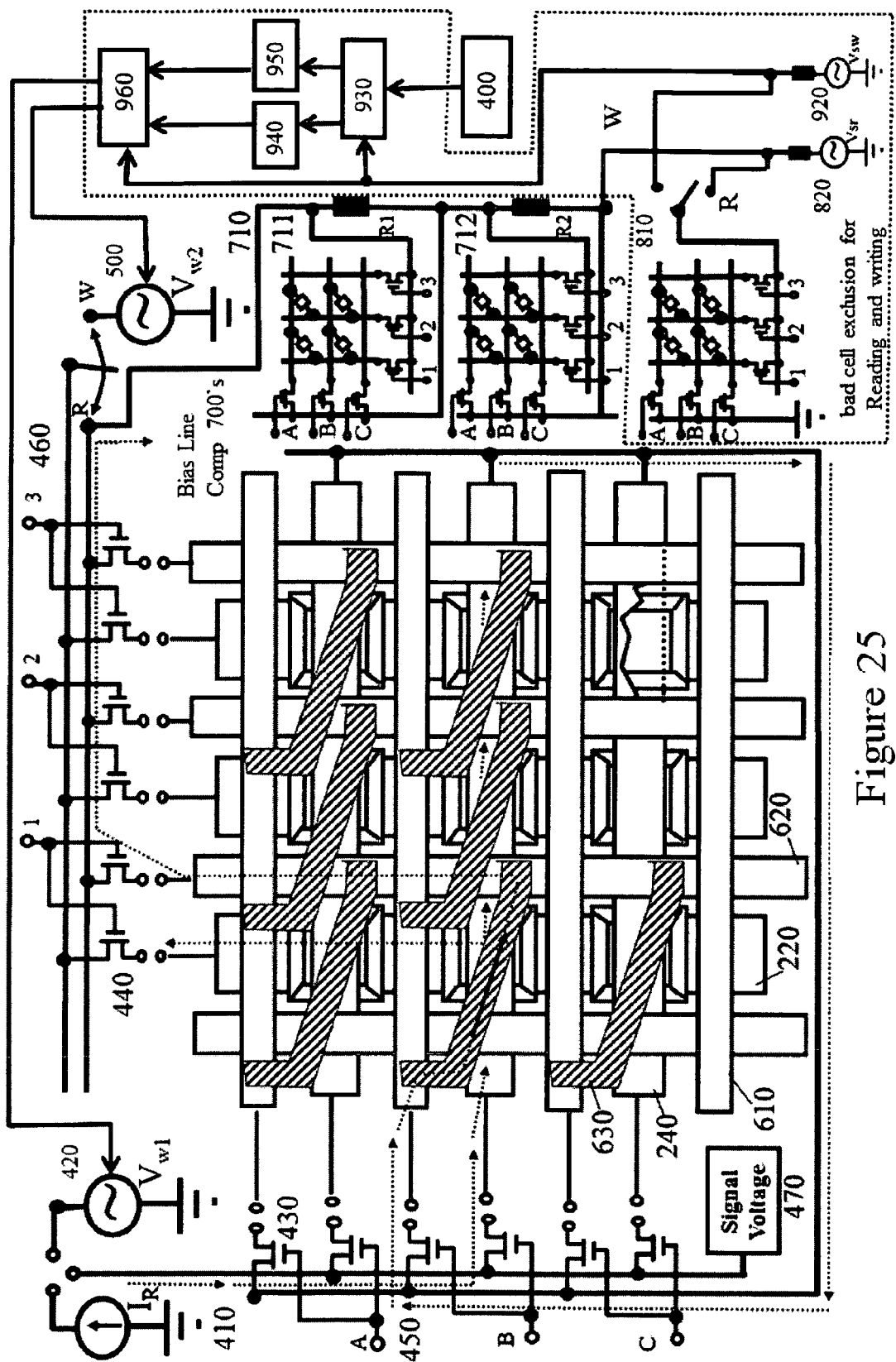
Figure 26:
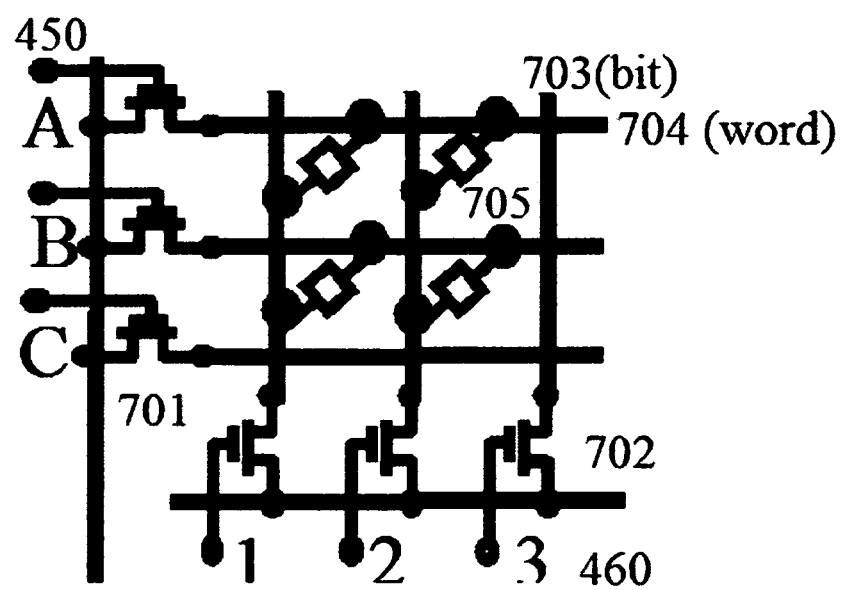

The invention contains for following Figures:

FIG. 1: shown an example of basic STT-based MRAM, but using shared PL or AFC (for both longitudinal and perpendicular configurations) in contras with conventional STT-based MRAM;

FIG. 2: shown an example STT-based MRAM, but using shared PL or AFC, FL is in shape of parallelogram;

FIG. 3: shown an example STT-based MRAM, but using shared PL or AFC, FL is in shape of smoothed parallelogram;

FIG. 4: shown an example STT-based MRAM, but using shared PL or AFC, FL is in shape of rhombus;

FIG. 5: shown another example STT-based MRAM, but using shared PL or AFC, FL is in shape of rhombus, the width of rhombus is restricted within bottom lead range;

FIG. 6: shown an example STT-based MRAM, but using shared PL or AFC, FL is in shape of rhombus, and with V shape top leads;

FIG. 7: shown an example of process: deposition of layers, bottom leads milling or/and etching, deposition of insulator, and CMP;

FIG. 8: shown an example of process: mask or photo-resist preparation for FL and top leads milling or/and etching;

FIG. 9: shown an example of process: finished structure in the $3^{rd}$ dimension with x- and y-direction views;

FIG. 10: shown another example of process for improving process control accuracy for storage layers, layer deposition stops after bottom lead layer, then milling or/and etching to bottom of insulator layer;

FIG. 11: shown another example of process, for improving process control accuracy for storage layers, deposition of other layers after these layers in FIG. 10;

FIG. 12: show an example of basic driven circuit modules for making MRAM based on the spirit for both longitudinal and perpendicular configurations;

FIG. 13: show an example of driven circuit modules for making MRAM based on the spirit for both longitudinal and perpendicular configurations, with large current by second voltage source to speed up STT flipping;

FIG. 14: show an example of driven circuit modules for making MRAM, using the same large current for speeding up STT flipping to heat cells globally;

FIG. 15: show an example of driven circuit modules for making MRAM, using the same large current for speeding up STT flipping to heat cells column by column;

FIG. 16: show an example of driven circuit modules for making MRAM, using the same large current for speeding up STT flipping to heat cells row by row;

FIG. 17(a): show an example of driven circuit modules for making MRAM, using the same large current for speeding up STT flipping to heat cells individually;

FIG. 17(b): show another example of driven circuit modules for making MRAM, using the same large current for speeding up STT flipping to heat cells individually, each of the cells is almost surrounded by large writing current, so as to form a perpendicular field for perpendicular configuration;

FIG. 18: show an example of driven circuit modules for making MRAM, only for heating cells individually;

FIG. 19: show an example of driven circuit modules for making MRAM, using the same large current for speeding up STT flipping to heat cells individually, and with V shape top leads;

FIG. 20: show an example of driven circuit modules for making MRAM, only for heating cells individually, and with V shape top leads;

FIG. 21: show an example of driven circuit modules for making MRAM, with compensation modules for correcting the bias point, by series-connected compensation resistances;

FIG. 22: show an example of driven circuit modules for making MRAM, with compensation modules for correcting the bias point, by parallel-connected compensation resistances;

FIG. 23: show an example of driven circuit modules for making MRAM, with compensation modules for correcting the bias point, by compensation voltage sources;

FIG. 24: show an example of driven circuit modules for making MRAM, with compensation modules for correcting the bias point and reading exclusion module for excluding bad-cells, by series-connected compensation resistances as example;

FIG. 25: show an example of driven circuit modules for making MRAM, with compensation modules for correcting the bias point, exclusion module for excluding bad-cells when reading, and writing-jump-over module for jump-over bad-cells when writing, by series-connected compensation resistances as example;

FIG. 26: show an example of conductance for each cell-connection; cell-selection circuit board is a conductance matrix with same size of MRAM matrix;

In the details descriptions below, we will start with optimization of magnetic and geometric design and material selection, then address how to improve the write-ability, and finally, describe how to correct the bias point of extreme cells by using compensation module and how to removing outlier cells by using "writing jump-over" and "reading exclusion" modules.

I. Shared PL or AFC with Smaller AFM Grain Size to Increase Uniformity

In FIG. 1 (combine with FIG. 7 which shows an example how to build shared PL, but not limited to this configuration only) is shown a basic STT-based MRAM, but using shared PL or AFC (for both longitudinal and perpendicular configurations) in contras with conventional STT-based MRAM. The structure is starting on substrate 100, then insulate layer follows, above insulate layer 210 is bottom lead as bit lines 220, then deposit seed layer 310 for AFM layer and PL or AFC 320, between FL 340 and PL or AFC is barrier 330 for both longitudinal and perpendicular configurations, which may be classified into 320 in FIG. 1) if the FL is milled or/and etched to top of barrier, or may be classified into 340 in FIG. 1) if the FL is milled or/and etched to top of PL or AFC, so that the PL or AFC is shared by all cells in same column (i.e. bit line). Top lead layer 240 follows FL 340, which is for word lines; top lead contact layer 230 is required due to process need. In contras to this invention, in conventional STT-based MRAM, FL milling or/and etching is always down to top of seed layer 310 or lead layer 220, so the PL or AFC is not shared (i.e. belongs to each individual cell) and is very short, which needs larger grain size of AFM for larger Tb, and increases the cell to cell variation in reading signal (bias point, AMP and ASYM).

II. FL Shape Anisotropy Helps in Stability and Uniformity

Structures in FIGS. 2 to 5 are same as that in FIG. 1, but for longitudinal configuration only. In FIG. 2, FL is in shape of parallelogram for better stability (to eliminate multiple edge states, and form single edge state). Structure in FIG. 3 is same as that in FIG. 2, except the sharp angle of parallelogram is smoothed by a smoothed mask. Structure in FIG. 4 is same as that in FIG. 2, except FL is in shape of rhombus for better stability (single edge state). Structure in FIG. 5 is same as that in FIG. 4, except the width of rhombus is restricted within bottom lead range.

Structure in FIG. 6, using a trimmed rhombus as example, uses V shape top leads (word lines) which are applicable for both longitudinal and perpendicular configurations.

III. Geometries in the $3^{rd}$ Dimension and Process-Ability for MRAM Matrix

Examples of process based on longitudinal configurations (parts of them are applied to perpendicular configurations)

given in FIGS. 7 to 11 are not trying to give process flow for either longitudinal or perpendicular configurations, but only to show the structure in the 3rd dimension for better understanding this invention, meanwhile to show the process-ability. There are many processes (through DOE), which can achieve same or similar structure with the spirit of this invention. Therefore, this invention includes the process shown in FIGS. 7 to 11, but not limited to these processes. In each chart of FIGS. 7 to 11, the left chart shows the y-direction view and the right chart shows the x-direction view.

FIG. 7 top shows all layers deposited, the last layer (top) is top lead contact layer for accurate control of FL thickness (without this layer, CMP need to go down to top of FL - - - which produces large variation for FL thickness). The structure after bottom leads milling or/and etching, depositing insulator, and CMP is shown at bottom charts of FIG. 7 and top chart of FIG. 8. Bottom of FIG. 8 is shown mask or photo-resist preparation for FL and top leads milling or/and etching. Top of FIG. 9 show the structure after FL milling or/and etching and depositing insulator, which may be a commonly used insulator, or may be a special insulator for using thermagnonic spin-transfer torque to further help switching (more details in heating assistant switching will be shown later). The bottom charts of FIG. 9 shows the structure after CMP, which is the finished structure in the $3^{rd}$ dimension with x- and y-direction views for all the Figures from 1 to 6.

Above the top insulator layer in bottom charts of FIG. 9, when needed, the layers of leads for current of flipping-assistant-field, and/or current of heating resistance, and/or components of bias compensation module can be deposited.

Because bottom lead layer is thick, example of process in FIGS. 10 and 11 can improve process control accuracy for storage layers [i.e. seed layer, AFM, PL/AFC and FL]. As shown in FIG. 10, the layer deposition stops after bottom lead layer 220 [i.e. C], then milling or/and etching to bottom of insulator layer 210 [i.e. B], and then deposit insulator again, finally, CMP to top of bottom lead layer 220. After this step, FIG. 11 shows that all other layers are deposited, and follows same procedures and steps as mentioned in FIGS. 7 to 9.

IV. MRAM Driven Circuit Modules

FIGS. 12 to 25 show some examples of driven circuit modules for the methods of this invention, for making MRAM based on the spirit for both longitudinal and perpendicular configurations. Therefore, this invention includes the driven circuit modules shown in FIGS. 12 to 25, but not limited to these modules.

FIG. 12 shows an example of typical driven module for a conventional STT-based MRAM. Storage matrix is connected to a word line driver 450 and a bit line driver 460, each of unit in bit line driver 460 and word line driver 450 includes a voltage-controlled or current-controlled switch 440 and 430, respectively, both bit line driver and word line driver have multiple triggering inputs, 1, 2, 3, . . . etc and A, B, C, . . . etc, respectively. The triggering inputs control the switch 440 or 430 to switch on or off. During reading or writing, the triggering signals are simultaneously applied to storage matrix leads in pair (1, A), (2, B), (3, C), . . . , etc.

In FIG. 12 and all Figures after, the power line in word line driver is connected to reading current or voltage source 410 when reading, or is connected writing current or voltage source 420 when writing; while, the power line in bit line driver is connected to ground. However, the power line in word line driver can be swapped to connect to ground, and the power line in bit line driver can be swapped to connect to voltage or current source for all cases shown in FIG. 12 and all Figures after.

At reading status, the output voltage or current signal 470 is send to amplifier (and/or pre-amplifier), and then to decoder. During triggering signal scans over all pairs [(1,A), (2,B), (3,C), . . . , etc], the output signal 470 is varying corresponding to the data or message saved in the MRAM cells.

V. Flipping-Assistant-Field to Speed Up STT Flipping Process by Using Large Current to Improve Write-Ability Convention regarding STT: positive current—from FL to PL; negative current—from PL to FL. Under this convention and for some barrier material, if write current is positive, the FL magnetization trends to parallel to magnetization of PL; if negative, the FL magnetization trends to anti-parallel to magnetization of PL.

FIG. 13 shows an example of the method to speed up STT flipping process by using large current [again the method of this invention includes the all the examples in FIG. 13 and all Figures after, but not limited in these]. During writing, power line in driven module 460 is connected to a second voltage source 500, instead of being connected to ground in FIG. 12 [but during reading, it is switched to connect to ground], meanwhile the other end of top leads 240 are connected to an external resistor 510. Therefore, the STT current is controlled by the voltage difference Vw1−Vw2, and both Vw1 and resistor 510 determines the current, which creates "Flipping-assistant-field" for STT. When Vw1 and Vw2 flip sign (i.e. polarity) simultaneously, the STT current and current of "Flipping-assistant-field" follows, i.e. flip their sign simultaneously. For the current (dash lines) shown in FIG. 13, the PL and FL magnetization should be set and fixed upward or downward (i.e. along column direction) for longitudinal configuration, Flipping-assistant-field is parallel or anti-parallel to FL magnetization. For perpendicular configuration, PL and FL magnetization is out of or into paper plane; in this case, Flipping-assistant-field is vertical to FL magnetization, so it can reduce the initial torque and it still can speed up the flipping, same is applied for all FIGS. 13 to 25.

VI. Heating Method to Speed Up STT Flipping Process by Using Same Large Current to Further Improve Write-Ability The resistor 510 in FIG. 13 will produce heat under large current, and the heat will be wasted if using external resistor. By using the method shown in FIG. 14 and all Figures after, the heat can be used for further speed up the STT flipping, by either heating with conventional thermal nature or/and heating with thermagnonic spin-transfer torque. If for the latter, the insulator on top of FIG. 9 is replaced by insulating magnet, and with this structure (starting from FL): FL/metal spacer/magnetic mono-layer/insulating magnet/, which can further help to switch FL if the temperature difference is controlled according to the needs.

FIG. 14 shows an example for global heating design. A built-in resistor layer 520 above the top lead layer 240 is deposited, with a insulate layer in-between. At the top of storage cell, the current in heating resistor is along the same direct as that in top leads, so as to maximize (i.e. in same direction) "Flipping-assistant-field" for case of longitudinal configuration.

FIG. 15 shows an example for column heating design. A built-in resistor layer 530 above the top lead layer 240 is deposited, with a insulate layer in-between. The column heating resistor should be at top of MRAM cell, in FIG. 15, it is off-site the top of MRAM cell - - - just for easier drawing, and clear visualization, not really mean off-site.

FIG. 16 shows an example for row heating design. A built-in resistor layer 540 above the top lead layer 240 is deposited, with a insulate layer in-between. At the top of storage cell, the current in heating resistor is along the same direct as that in top leads, so as to maximize (i.e. in same direction) "Flipping-assistant-field". The row heating resistor should be at top of MRAM cell, in FIG. 16, it is off-site the top of MRAM cell - - - just for easier drawing, and clear visualization, not really mean off-site.

FIG. 17 (*a*) shows example for local (each cell) heating design for both longitudinal and perpendicular configurations. A built-in cell heating resistor layer 630 above the top lead layer 240 is deposited (as close to MRAM cell as possible), with a insulate layer in-between. After that, the column leads 610 and row leads 620 for cell heating are deposited. The cell heating resistor should be at bottom of column leads 610 and row leads 620, but in FIG. 17 (*a*) and all Figures after, it is on the most top, i.e. on top of column leads 610 and row leads 620 - - - just for easier drawing, and clear visualization, not necessarily mean at most top. The current in cell heating resistor is not but as much as possible along the same direct as that in top leads, so as to maximize (i.e. nearly in same direction) "flipping-assistant-field".

As mentioned in section V above, the heating-current-produced flipping-assistant-field works for both longitudinal and perpendicular configurations. For longitudinal configuration, it is parallel or anti-parallel to FL magnetization; for perpendicular configuration, it is vertical to FL magnetization, but it can increase the initial torque and so it can still speed up the flipping. However, for perpendicular configuration, we could design the circuit and heating resistor for heating current so that the heating current can fully wrap the cell or partially wrap the cell (such as a U-wrap configuration at top of each cell is shown in FIG. 17(*b*)), heating-current-produced flipping-assistant-field will roughly parallel or anti-parallel to FL magnetization. The U-wrap configuration of heating resistor and circuit for heating in FIG. 17(*b*) can be applied to all Figures from 17 to 25.

FIG. 18 shows an example for local (each cell) heating only design. It is similar to FIG. 17, but for heating only, the "flipping-assistant-field" is not provided. The voltage source Vw2 500 is removed, and voltage source 600 is added.

FIG. 19 shows an example for local (each cell) heating design, same as FIG. 17, but it is for V shape top leads (word lines) [such as, when the trimmed rhombus FL is used for higher cell density].

FIG. 20 shows an example for local (each cell) heating only design. It is similar to FIG. 18, but for heating only, the "flipping-assistant-field" is not provided. The voltage source Vw2 500 is removed, and voltage source 600 is added.

VII. Compensation Module for Correcting the Bias Point to Improve Bias Uniformity and Manufacturability Production yield rate of MRAM is bottleneck for its manufacturability. Yield rate is limited by two major causes: (1) bad uniformity; (2) bad-cell whose performance, bias point, and write-ability are out of range. Cells in a product must be uniform in performance and bias voltages (or bias resistances). To improve the bias uniformity, using compensation module (built-together with MRAM) to correct the bias point of each cell is invented in this invention, which is called bias compensation. FIGS. 21 to 25 only show a few examples of method of making compensation modules, such as, 710, or 720, or 730, based on the spirit of this invention. Therefore, this invention includes compensation modules shown in FIGS. 21 to 25, but not limited to these modules.

Also, this compensation method can be applied to all kinds of RAM, not limited to MRAM only.

VII.1 Compensation Module's Cell-Selection Circuit Boards

The compensation module includes multiple but at least one cell-selection circuit boards, but in the FIGS. 21 to 23, 3 circuit boards are shown, such as, (711, 712, 713) or (721, 722, 723) or (731, 732, 733). Each cell-selection circuit board is a conductance matrix with same size of MRAM matrix, the conductance at each cell connects (or disconnects if conductance is pre-set as zero) the crossed word line (A,B,C, . . . , etc) and bit line (1,2,3, . . . , etc), which are corresponding the word lines and bit lines of MRAM matrix. In other words, word/bit lines of cell-selection circuit board are controlled simultaneously with the corresponding word/bit lines of MRAM by same trigger signal. All word lines of different cell-selection circuit board (if more than one) and corresponding word lines of MRAM are parallel connected to same trigger signal source; and all bit lines of different cell-selection circuit board (if more than one) and corresponding bit lines of MRAM are parallel connected to same trigger signal source.

The power line in bit line driver of MRAM during reading is connected to compensation module (as shown in FIGS. 21 to 23, which are based on FIG. 17 only as an example, but not limited to this case only), instead of connection to ground during reading (as shown in FIGS. 12 to 20), and current in bit power line goes through the compensation resistor or compensation voltage, then to ground. During reading, the power line in bit line driver is switched to compensation module; while during writing, the power line in bit line driver is switched to ground.

If more than one, the cell-selection circuit boards can be connected in parallel or in series, or in the mixed if more than two. The cell-selection circuit board can be external or built-in with MRAM. If built-in with MRAM, the manufacturing procedures bellow from bottom to top is (but not limited to this):

. . . . . . . . . . . .
   Cell-Selection Circuit Board 3
     Insulate layer
   Cell-selection circuit board 2
     Insulate layer
   Cell-selection circuit board 1
     Insulate layer
     Heating matrix (if used)
   Conventional insulate layer or Insulating magnet layer
     (with/spacer/magnetic mono-layer/)
     MRAM matrix
      Insulate layer
       Substrate If the compensation module is used for RAM, then the MRAM matrix and heating matrix are replaced by RAM matrix above.

VII.2 how to Achieve Multiple Level Compensations

The bias compensation can be resistance compensation, examples are shown in FIGS. 21, 22, or voltage level compensation, the example is shown in FIG. 23. The number of compensation levels is increasing as the number of cell-selection circuit boards (with resistances or voltage sources) increases. For example, FIG. 21 shows example of series connection case with three cell-selection circuit boards with resistances R1, R2 and R3, which can achieve 8 levels of compensation: $0<R1<R2<R1+R2<R3<R1+R3<R2+R3<R1+R2+R3$; but cell-selection circuit boards with two resistances (not shown) can only achieve 4 levels of compensation: $0<R1<R2<R1+R2$ (in general, n cell-selection circuit boards with n resistances can achieve $2^n$ levels of compensation); FIG. 22 shows example of parallel connection case with three cell-selection circuit boards with resistances, R1, R2 and R3, which only can achieve (effectively) 5 levels of compensation: $R1>R2>R1//R2>R3>0$[other levels R1//R3, R2//R3, R1//R2//R3 are too close to R3, and is not as good as series connection, where R1//R2 means parallel resistance of R1 and R2=R1*R2/(R1+R2)]. If the number of cell-selection circuit boards in FIG. 22 is reduced from 3 to 2, then 4 level compensations can be achieved: R1>R2>R1//R2>0; FIG. 23 shows example of parallel connection case with three cell-selection circuit boards with voltage sources V1, V2 and V3, which can only achieve 4 levels of compensation, but has a flexibility to adjust the voltages.

VII.3 Principle of Bias Compensation

If there are N compensation levels, the bias resistance range, say for example from −m sigma to +m sigma in a Gaussian distribution with standard deviation sigma, is divided by N and form N zones [number of levels need to be optimized], then for each zone, a compensation resistance or voltage is assigned. For example, if we have 4 levels compensations 0<R1<R2<R1+R2 (especially, set R1=alpha*R0, R2=(1−alpha)*R0, R1+R2=1.0*R0, and set m=6 [then (−6, −3, 0, +3, +6) sigma are zone boundaries], we can have 4 zones: Zone 1 (−m to m/2) sigma, Zone 2 (−m/2 to 0) sigma, and Zone 3 (0 to +m/2) sigma, and Zone 4 (+m/2 to +m) sigma, where R0, or median resistance of compensation resistances 0.5*R0, alpha and m can be optimized by DOE or BER analysis. Therefore, for a cell whose bias resistance is in Zone 1, the cell needs to be assigned to lowest resistance 0, or highest voltage compensation level; for a cell whose bias resistance is in Zone 2, the cell needs to be compensated with median resistance R1, or second high voltage compensation level; for a cell whose bias resistance is in Zone 3, the cell needs to be compensated with resistance R2, or third high voltage compensation level; for a cell whose bias resistance is in Zone 4, the cell needs to be compensated with resistance R1+R2, or lowest voltage compensation level. For the cell whose bias resistance is out of these 4 Zones (i.e. bad-cells), we will use exclusion method to exclude them, which will be described later.

VII.4 Maintainable if Using PROM-Like

If using fuse as the conductance, then we need manufacture all cells in all cell-selection circuit boards as conductive at beginning. Then, if a cell needs to be conductive, just keep it as fuse; if a cell needs to be non-conductive, just milts the fuse by programmed manufacture equipment. Therefore, this is permanent setup, and we cannot change it later.

If using PROM or PROM-like as conductance, we may be able to re-set the cell compensation resistances of MRAM, as long as the manufacturer provides the software program. This may be useful, because magnetic device has instability vs long time, say after 5 years, one or more cells in MRAM change their bias resistance.

VIII. Exclusion Module to Remove Bad-Cells to Improve Manufacturability

As mentioned in section VII.3 above, the second factor limiting MRAM's manufacturability is bad-cell whose performance and bias are out of range. For the bad cell whose bias resistance is out of these, Zones in which the compensation cannot handle, such as the resistance is in the zone (−infinite to −m sigma) and the zone(m sigma to +infinite) in the example mention above, or their performance is out of range, or has poor write-ability, or its SNR performance or write-ability is below criteria after bias compensation, we will use exclusion module 810 to remove them, which is built together with compensation module in MRAM. Bad-cell exclusion includes one of or both of "reading exclusion" (i.e. the circuit board 810 and voltage source 820, as shown in FIGS. 24 and 25) and "writing jump-over" (i.e. the write-bit-stream managing blocks 930 to 960 and voltage source 920, as shown in FIG. 25).

VIII.1 Principle of Reading Exclusion

The cell-selection circuit board 810 for selecting bad-cell in FIG. 24 is built in same way as circuit boards for bias compensation modules, and has same method to connect with MRAM as the other cell-selection circuit boards mentioned above. Therefore, if a cell whose bias resistance is out of the range the compensation can handle or its SNR performance is below criteria after bias compensation, the conductance of this cell in this circuit board is set to zero (such as, melt the fuse if it is fuse-based for example), then the extremely high or extremely low voltage from voltage source 820 in FIG. 24 (just as an example to illustrate the spirit of this invention, but not limited to this circuit because there are many circuit can achieve this purpose) will apply to this cell, as a result, the reading voltage at output signal voltage 470 will be extremely high or extremely low, the decoding circuit or decoding algorithm will detect this extremely voltage, and fix this bit according to the rule of encoding [such as, double-bit check if encoding with double-bit (efficiency reduces to half), or parity check if encoding with a special parity], or just exclude this bit (in this case, need help from "writing jump-over" described below when writing bit).

VIII.2 Principle of Writing Jump-Over

For "writing jump-over" when writing bit, we also need a circuit board for selecting bad-cell. This circuit board can be a separate one (not shown in Figures), or share with that used in reading exclusion mentioned above, as shown FIG. 25 - - - when reading, this cell-selection circuit board is switch voltage source 820, when writing it is switched to voltage source 920. To manage write-bit-stream, we also need circuit blocks 930, 940, 950 and 960 (called jump-over management circuit for "writing jump-over"). For all the cases without "writing jump-over" described before, data managing block 400 (not shown in all Figures from 12 to 24) will prepare bit data stream and address data stream and send bit stream to writing current sources 420 and 500, and send address stream to word lines (460) and bit lines (450) for cell-selection. However, for the cases with "writing jump-over", as shown in FIG. 25, data managing block 400 will not send bit stream directly to writing current sources 420 and 500, but send bit stream to circuit blocks 930, 940, 950 and 960 first for the bit to jump-over the bad cells, then send to writing current sources 420 and 500. Based on the original bit stream from block 400, stream preparation block 930 prepares two branches of bit streams: stream in one branch such as 940 is reference stream and stream in another branch such as 950 is "delayed stream" with same bit information, the "delayed stream" has one bit delay than reference stream for outlier cell and no-delay for normal cell. Stream selection block 960 is a stream selector or switch, which decides which bit stream (940 or 950) should pass to writing current sources 420 and 500, based on the voltage from circuit board 810 for selecting bad-cell. For normal cells, voltage from circuit board 810 is zero or ground (cell is conductive), for the bad-cell, voltage 810 is non-zero. Therefore, when scanning to a bad-cell, voltage 810 will control stream selection block 960 to choose to the stream with bit delay, meanwhile it will control stream preparation block 930 to update the two bit stream, now the steam in 950 becomes reference stream, and stream in 940 need to delay one bit than 950 and delay 2 bits than original stream, and so on . . . . In this way, all bits without any missing in original stream are written into MRAM, and with help from "reading exclusion" mentioned above, all bits without any missing in original stream can be read back. Without this "writing jump-over", all the bits at bad-cells will be lost, and in this case very high redundant encoding and decoding algorithm (such as using double-bits, or treble bits, etc.) is needed to recover the right bit information.

Circuit board(s) for "reading exclusion" and "writing jump-over" can be built before the first cell-selection circuit board or after the last cell-selection circuit board of bias compensation, or at any layer between the first and last cell-selection circuit boards of bias compensation.

VX. Composition and Setup of Compensation Modules and Exclusion Modules

Each cell-selection circuit board is a conductance matrix with same size of MRAM matrix. As shown in FIG. 26, the conductance 705 at each cell connects (or disconnects if conductance is pre-set as zero) the crossed word line 704 with bit line 703 for this cell. For a very simple example, conductance is made of fuse; at beginning, all cells are made with fuse; Actually, any ROM or ROM-like technologies (such as ROM, PROM, EPROM, EEPROM, . . . , etc) in the past, current and in the future can be used for cell-selection circuit board, but not limited to these ROM's or fuse mentioned.

After processes for all components (MRAM matrix, Heating matrix if used, cell-selection circuit boards if used, bad-cell exclusion module if used) of MRAM device are finished, manufacture test equipment makes quick bias resistance test for all cells in the MRAM, and then the sigma and mean of bias resistance can be obtained. Based on the mean and sigma, optimization analysis of resistance zone ranges and zone boundaries for given number of compensation levels are carried out. According to resistance zone ranges and zone boundaries, and bias resistance of each cell, the manufacture equipment sets up the conductance in each cell of each cell-selection circuit board. Let use the example with 4 levels of compensation mentioned above, if the bias resistance of a cell (i,j) in MRAM is in Zone 1, means we need to set the compensation resistance as 0, then set the conductance cell (i,j) in all boards be conductive; if the bias resistance of a cell (i,j) in MRAM is in Zone 2, means we need to set the compensation resistance as R1, so we need to set the conductance cell (i,j) in cell-selection circuit board 1 be conductive and set the conductance cells (i,j) in all other circuit boards nonconductive; and if the bias resistance of a cell (i,j) in MRAM is in Zone 3, means we need to set the compensation resistance as R2, then set the conductance cell (i,j) in circuit board 2 be conductive and set the conductance cells (i,j) in all other circuit boards nonconductive; and if the bias resistance of a cell (i,j) in MRAM is in Zone 4, means we need to set the compensation resistance as R1+R2, then set the conductance cell (i,j) in both circuit board 1 and circuit board 2 be conductive and set the conductance cells (i,j) in all other circuit boards [if more than 2] nonconductive.

What is claimed is:

1. A method for improving manufacturability or production yield rate of magneto-resistive random access memory (MRAM) comprise at least one the following steps:
    (1) compensating bias or operation point by using cell-selection circuit board and compensation module through bias compensation method, so as to reduce bias distribution range and increase bias uniformity;
    (2) excluding outlier cells and bad cells when reading by using cell-selection circuit board and exclusion module for reading through the reading exclusion method;
    (3) excluding outlier cells and bad cells when writing by using write-jump-over management circuit blocks and exclusion module for writing through write jump-over method;
    (4) improve stability and uniformity by optimizing magnetic and geometric design of MRAM cells through using shared PL (pinned layer) and AFC (ferro-magnetically coupled layers) with smaller AFM (anti-ferro-magnetism) grain size to increase uniformity, and adjusting FL (free layer) shape anisotropy; and
    (5) improving write-ability by using same heating current for both heating cells and providing flipping-assistant-field to doubly speed up flipping process of cells.

2. The method of claim 1, wherein the exclusion method for excluding outlier and bad cells in MRAM comprises at least one of the following steps:
    (1) identifying bad cells in MRAM matrix from multiple performance distributions;
    (2) identifying outlier cells in MRAM matrix from tails at two sides of each distribution of multiple performances through statistical analysis;
    (3) marking or setting outlier and bad cells by using cell-selection circuit board, which is a part of exclusion module;
    (4) excluding the data bit when reading to outlier or bad cells by using cell-selection circuit board in exclusion module through reading exclusion method; and
    (5) excluding the data bit when writing to outlier or bad cells by using write-jump-over management circuit blocks in exclusion module and using voltage-level-compensation-based cell-selection circuit board through write-jump-over method;
    wherein, cell-selection circuit board of "reading exclusion" is either voltage-source-based or resistance-based;
    wherein, the settings of cell-selection circuit board is either built-in at manufacturing or maintainable in the future use;
    wherein, mentioned method for excluding outlier cells and bad cells is applicable for any type random access memory (RAM);
    wherein, exclusion module is either manufactured together with a MRAM chip or a separate chip external to MRAM chip.

3. The method of claim 2, wherein cell-selection circuit board is external or built-in with MRAM or RAM.

4. The method of excluding outlier cells according to claim 2, wherein the procedures of reading exclusion method comprises at least one of
    (1) determining outlier cells or bad cells from statistic performance distributions, such as by checking whether cell's bias resistance after bias compensation or signal asymmetry is out of range or not, and by checking whether signal SNR performance is below criteria;
    (2) for any normal cell, the conductance of this cell in this circuit board is properly set so that MRAM ground wire when reading is directly connected to ground, which leads to normal signal output;
    (3) for any outlier cell or bad cell, the conductance of this cell in this circuit board is properly set so that MRAM ground wire when reading is firstly connected to extremely high or extremely low voltage source, then connected to ground, which leads to extremely high or extremely low signal output; and
    (4) decoding circuit or decoding algorithm will detect this extremely voltage, and fix this bit according to the rule of encoding or just exclude this bit accompanying with the use of "writing jump-over" method.

5. The method of excluding outlier cells according to claim 2, wherein the procedures of "write jump over" method comprises at least one of steps:
    (1) determining outlier cells or bad cells from statistic performance distributions, such as by checking whether cell's bias resistance after bias compensation or signal asymmetry is out of range or not, and by checking whether signal SNR performance is below criteria or not;

(2) for any normal cell, the conductance of this cell in this circuit board is properly set so that the stream preparation block and stream selection block when reading are directly connected to ground, which leads to normal input signal for two blocks; and (3) for any outlier cell, the conductance of this cell in this circuit board is properly set so that the stream preparation block and stream selection block when reading is firstly connected to a voltage source, then connected to ground, which leads to abnormal input signal for two blocks, and this abnormal input signal trigs or updates the bit steam in one of the two branches of stream preparation block to delay one bit than that in the other branch, and trigs stream selection block to make selection of sending reference stream or sending delayed stream.

6. The method of claim 2, wherein the exclusion module for excluding outlier and bad cells in MRAM so as to improve MRAM manufacturability, comprises at least one of
   (1) cell-selection circuit board of outliers or bad cells for reading;
   (2) cell-selection circuit board of outliers or bad cells for writing;
   (3) write-jump-over management circuit blocks for writing;
   (4) means for identifying bad cells in MRAM matrix through using data of multiple performance distributions;
   (5) means for identifying outlier cells in MRAM matrix from tails at two sides of each distribution of multiple performances through statistical analysis;
   (6) means for marking or setting outlier and bad cells by using cell-selection circuit board;
   (7) means for excluding the data bit when reading to outlier or bad cells by using cell-selection circuit board through reading exclusion method; and
   (8) means for excluding the data bit when writing to outlier or bad cells by using write-jump-over management circuit blocks and using voltage-level-compensation based cell-selection circuit board through write-jump-over method.

7. The method of claim 1, wherein the compensation method for compensating bias or operation points of MRAM cells by using compensation module so as to improve MRAM manufacturability or production yield rate, comprises at least one of following steps:
   (1) grouping bias or operation points into at least 3 groups by dividing distribution chart of bias points into at least 3 zones;
   (2) marking or pre-setting single or multiple resistances or voltage sources in single or multiple cell-selection circuit boards of compensation so as to assign a resistance or a voltage source to all cells in each zone of bias; and
   (3) shifting bias or operation points automatically with pre-determined amount in each zone when reading, by using the said pre-set single or multiple cell-selection circuit boards, so as to reduce bias distribution range and increase bias uniformity;
   wherein, the cell-selection circuit board(s) of compensation, correspondingly with multiple resistances or multiple voltage sources, can be connected in parallel or in series, or in any mixed ways, to achieve multiple levels of compensation;
   wherein, cell-selection circuit board of compensation is either voltage-source-based or resistance-based;
   wherein, the settings of cell-selection circuit board of compensation is either built-in at manufacturing or maintainable in the future use.

8. The method of claim 7, wherein any one of the cell-selection circuit board (s) is external or built-in with MRAM- or RAM.

9. The method of compensating bias or operation points according to claim 7, wherein the procedures for bias compensation method comprises at least one of steps:
   (1) from statistic performance distributions, determining bias resistance of each of the cells in MRAM matrix, and classifying the bias resistance into multiple zones in properly predetermined range;
   (2) assigning a resistance compensation level or voltage compensation level for each of these bias resistance zones;
   (3) determining what kind resistance connection or composition can achieve this required resistance compensation level if using resistance to compensate; and
   (4) determining the conductance of all corresponding cells in multiple cell-selection circuit board (s) for this MRAM cell, according to the required resistance connection or composition, or according to the required compensation voltage if using voltage compensation.

10. The method of claim 7, wherein the compensation module for compensating bias or operation points of MRAM cells so as to improve MRAM manufacturability or production yield rate comprises at least one of
   (1) cell-selection circuit boards of compensation;
   (2) means for grouping bias or operation points into at least 2 groups by dividing distribution chart of bias points into at least 2 zones, and cell-selection circuit board for one zone;
   (3) means for marking or pre-setting single or multiple resistances or voltage sources in single or multiple cell-selection circuit boards of compensation so as to assign a resistance or a voltage source to all cells in each zone of bias; and
   (4) means for shifting bias or operation points automatically with pre-determined amount in each zone when reading, by using the said pre-set single or multiple cell-selection circuit boards, so as to reduce bias distribution range and increase bias uniformity.

11. The method of claim 1, wherein exclusion module for marking, identifying and excluding the bit corresponding to outlier or bad cells in MRAM from reading stream, so as to improve manufacturability or production yield rate, comprises at least one of
   (1) a reading exclusion module comprises a cell-selection circuit boards connected with a resistance and a voltage source; and
   (2) a write jump-over module comprises a cell-selection circuit boards connected with a resistance and a voltage source, and circuit blocks for write-jump-over management.

12. The method of claim 1, wherein compensation module for shifting bias or operation points in single level or multiple levels, reducing their distribution range and increasing bias uniformity so as to improve MRAM manufacturability or production yield rate, comprises:
   (1) single or multiple cell-selection circuit board (s); and
   (2) single or multiple resistance (s) or voltage source(s) correspondingly connecting to each of cell-selection circuit boards;
   wherein, the cell-selection circuit board (s)—with correspondingly single or multiple resistance (s) or voltage source(s), can be connected in parallel or in series, or in any mixed ways.

13. The method of claim 1, wherein method of optimizing magnetic and geometric design comprises at least one of steps:
  (1) using shared fixed-magnetic-reference-layer (FMRL) for both longitudinal and perpendicular configurations, which provides favorable shape anisotropy for magnetically stability;
  (2) using shared anti-ferro-magnetism (AFM) material with small grain size to reduce the variation due to grain size so as to improve cell's performance uniformity for both longitudinal and perpendicular configurations;
  (3) using properly large aspect ratio along magnetization direction for free layer (FL) to properly set the FL stability of cells to improve magnetic stability, wherein, magnetization direction of FL for perpendicular configuration is along vertical direction or vertical to paper plane, magnetization direction of FL for longitudinal configuration is in paper plane or horizontal direction; and
  (4) using special geometries, such as rhombus, or parallelogram, or trimmed rhombus with properly large FL aspect ratio for longitudinal configuration to eliminate the multiple edge states so as to improve stability and increase uniformity of reading signal (bias point, amplitude and asymmetry);
  wherein, FMRL may be either layer pinned layer (PL) or anti-parallel-ferro-magnetically coupled layers (AFC), or any other kind to provide same function of PL;
  wherein, the shared AFM provides pinning field for shared FMRL, the FMRL with favorable geometry provides large shape anisotropy, which overcomes the backward of lower Tb due to small grain size of AFM.

14. The method of claim 1, wherein method of improving write-ability comprises at least one of steps:
  (1) speeding up flipping process of cell's spin torque transfer (STT) by using heating current and heating resistance to heat cells with conventional thermal nature or to heat with thermagnonic spin-transfer torque, so as to reduce the coercivity of cell's FL; and
  (2) utilizing the same heating current used to form a flipping-assistant-field, so as to further speed up flipping process of STT;
  wherein, heating configuration is any one of global heating, or row heating, or column heating, or local cell-heating;
  wherein, besides a current or voltage source used for providing writing current for STT, second independent voltage or current source and resistors or a resistor matrix are used to provide heating;
  wherein, the heating current wires, located at anywhere in any shape, such as at top of FL, are so designed that "Flipping-assistant-field" produced by this heating current is nearly parallel or anti-parallel to the magnetization direction of FL for longitudinal configuration;
  wherein, for perpendicular configurations, in most cases, "Flipping-assistant-field" produced by this heating current is nearly vertical to the magnetization direction of FL, which can increase the initial torque and so it can still speed up the flipping;
  wherein, the U-wrap configuration of heating current wires for local cell-heating produces better "Flipping-assistant-field" by same heating current for perpendicular configurations, so that it is nearly parallel or anti-parallel to the magnetization direction of FL.

15. The method of claim 1, wherein the cell-selection circuit board, comprises an electric conductance matrix with same size of MRAM matrix, or RAM matrix;
  wherein, the conductance at each cell connects word line with bit line at cross in conductance matrix, which are correspondingly connected to the corresponding word lines and bit lines of MRAM matrix, of RAM matrix, or of matrix of the last one of cell-selection circuit boards in the modules for which cell-selection circuit board is applied;
  wherein, when for exclusion, the selected cell of the mentioned matrices is connected either to ground or to a resistance and voltage source depending on the conductance setup, which either leads to normal output voltage or leads to identifiable extreme high or low output voltage, and the values of conductance at each of the cells in conductance matrix, either zero or non-zero corresponding to not-conducting electrons or conducting electrons, respectively, are predetermined according to addresses of outlier cells or normal cells, respectively;
  wherein, when for compensation, the selected cell of mentioned matrices is connected to the corresponding resistance or voltage source when parallel connection, or is connected to ground or to the corresponding cell in next cell-selection circuit board of compensation module by shorting the corresponding resistance of this cell-selection circuit board when series connection, o as to provide required compensation resistance or compensation voltage, and the values of conductance at each of the cells in conductance matrix, either zero or non-zero corresponding to not-conducting electrons or conducting electrons, are predetermined according to addresses and compensation level of each individual cell;
  wherein, conductance matrix is permanently set at time of manufacture if using fuse as the conductance, or is maintainable, i.e. is able to be re-set in the future according to the need if using PROM or PROM-like as conductance.

16. The method according to claim 1, said write-jump-over management circuit blocks comprises at least one of
  (1) stream preparation block with two branches for creating reference stream or delayed stream;
  (2) stream selection block to make selection of sending reference stream or delayed stream; and
  (3) a resistance or a voltage source correspondingly connecting to stream preparation block and stream selection block to providing trig signal for abnormal cells.

17. The method of claim 1, wherein an information storage device, comprises a storing cell matrix and at least one of
  (1) compensation module for compensating bias or operation point by using bias compensation method, so as to reduce bias distribution range and increase bias uniformity;
  (2) exclusion module for excluding outlier cells and bad cells when reading by using reading exclusion method; and
  (3) exclusion module for excluding outlier cells and bad cells when writing by using write-jump-over method;
  wherein, the stability and uniformity are improved by optimizing magnetic and geometric design of storing cell matrix;
  wherein, the write-ability is improved by using same heating current for both heating cells and providing flipping-assistant-field to doubly speed up flipping process of cells.

* * * * *